(12) United States Patent
Bojer et al.

(10) Patent No.: US 10,320,357 B2
(45) Date of Patent: *Jun. 11, 2019

(54) ELECTROMAGNETIC TUNABLE FILTER SYSTEMS, DEVICES, AND METHODS IN A WIRELESS COMMUNICATION NETWORK FOR SUPPORTING MULTIPLE FREQUENCY BANDS

(71) Applicant: Wispry, Inc., Irvine, CA (US)

(72) Inventors: Jorgen Bojer, Vadum (DK); Peter Dam Madsen, Gistrup (DK); Arthur S. Morris, Lakewood, CO (US)

(73) Assignee: WISPRY, INC., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/402,982

(22) Filed: Jan. 10, 2017

(65) Prior Publication Data

US 2017/0244376 A1    Aug. 24, 2017

Related U.S. Application Data

(63) Continuation-in-part of application No. 14/216,331, filed on Mar. 17, 2014, now Pat. No. 9,559,659, and (Continued)

(51) Int. Cl.
*H04B 7/005* (2006.01)
*H03H 7/01* (2006.01)

(52) U.S. Cl.
CPC ........ *H03H 7/0153* (2013.01); *H03H 7/0115* (2013.01); *H03H 7/175* (2013.01);

(Continued)

(58) Field of Classification Search
CPC .. H03H 7/0153; H03H 7/0115; H03H 7/0138; H03H 7/463
See application file for complete search history.

(56) References Cited

U.S. PATENT DOCUMENTS

| 5,541,558 A | 7/1996 | Weber et al. |
| 6,411,178 B1 | 6/2002 | Matsumura et al. |

(Continued)

FOREIGN PATENT DOCUMENTS

| CN | 102 460 826 A | 5/2012 |
| CN | 102593837 A | 7/2012 |

(Continued)

OTHER PUBLICATIONS

Corrected Notice of Allowance for U.S. Appl. No. 14/446,270 dated Jul. 13, 2017.

(Continued)

*Primary Examiner* — Abdelnabi O Musa
(74) *Attorney, Agent, or Firm* — Jenkins, Wilson, Taylor & Hunt, P.A.

(57) ABSTRACT

Systems, devices, and methods for tunable filters that are configured to support multiple frequency bands, such as within the field of cellular radio communication, can include a first resonator and a second resonator configured to block signals within one or more frequency ranges, and one or more coupling element connected to both the first resonator and the second resonator. The one or more coupling element can be configured to provide low insertion loss within a pass band.

17 Claims, 18 Drawing Sheets

Related U.S. Application Data a continuation-in-part of application No. 14/446,270, filed on Jul. 29, 2014, now Pat. No. 9,748,916.

(60) Provisional application No. 61/793,089, filed on Mar. 15, 2013, provisional application No. 61/859,621, filed on Jul. 29, 2013.

(52) U.S. Cl.
CPC ........ *H03H 7/1758* (2013.01); *H03H 7/1766* (2013.01); *H03H 2007/013* (2013.01); *H03H 2210/012* (2013.01); *H03H 2210/025* (2013.01); *H03H 2210/033* (2013.01)

(56) References Cited

U.S. PATENT DOCUMENTS

| | | | |
|---|---|---|---|
| 6,686,817 | B2 | 2/2004 | Zhu et al. |
| 9,035,727 | B2 | 5/2015 | Han et al. |
| 9,559,659 | B2 | 1/2017 | Bojer |
| 9,748,916 | B2 | 8/2017 | Bojer et al. |
| 2002/0079885 | A1 | 6/2002 | Estep et al. |
| 2002/0186099 | A1* | 12/2002 | Sengupta ............. H01P 1/20 333/174 |
| 2004/0127178 | A1 | 7/2004 | Kuffner |
| 2004/0130414 | A1* | 7/2004 | Marquardt ........... H03H 7/0161 333/174 |
| 2005/0007212 | A1 | 1/2005 | Shamsaifar et al. |
| 2005/0148312 | A1 | 7/2005 | Toncich et al. |
| 2006/0046682 | A1 | 3/2006 | Chen |
| 2006/0087387 | A1 | 4/2006 | Kubota et al. |
| 2006/0145782 | A1 | 7/2006 | Liu et al. |
| 2006/0229030 | A1 | 10/2006 | Simon et al. |
| 2006/0290445 | A1 | 12/2006 | Su et al. |
| 2007/0247261 | A1* | 10/2007 | Tsuzuki ............... H01P 1/20 333/202 |
| 2009/0286569 | A1 | 11/2009 | Rousu et al. |
| 2011/0012696 | A1 | 1/2011 | Skarp |
| 2011/0018654 | A1 | 1/2011 | Bradley et al. |
| 2011/0169589 | A1 | 7/2011 | Franzon et al. |
| 2011/0267119 | A1 | 11/2011 | Koechlin et al. |
| 2012/0094623 | A1 | 4/2012 | Khlat et al. |
| 2012/0112853 | A1 | 5/2012 | Hikino et al. |
| 2013/0162374 | A1 | 6/2013 | Tamiazzo et al. |
| 2015/0270820 | A1 | 9/2015 | Cherif |
| 2016/0020750 | A1* | 1/2016 | Burgener ............. H03H 9/542 333/188 |

FOREIGN PATENT DOCUMENTS

| | | |
|---|---|---|
| CN | 202737827 U | 2/2013 |
| CN | 105 210 291 B | 10/2018 |
| EP | 2 429 026 A1 | 3/2012 |
| EP | 2 974 011 A2 | 1/2016 |
| WO | WO 02/084686 A1 | 10/2002 |
| WO | WO 2010/033057 A1 | 3/2010 |
| WO | WO 2012/025946 A1 | 3/2012 |
| WO | WO 2012/079084 A2 | 6/2012 |
| WO | WO 2014/145662 | 9/2014 |
| WO | WO 2015/017452 | 2/2015 |
| WO | WO 2016/196981 A1 | 12/2016 |
| WO | WO 2018/132314 A1 | 7/2018 |

OTHER PUBLICATIONS

Extended European Search Report for Application No. 14832808 dated Sep. 6, 2017.
Chinese Office Action for Chinese Application No. 201480027304.5 dated Nov. 16, 2017.
International Search Report for Application No. PCT/US2014/030466 dated Sep. 9, 2014.
IPRP and Written Opinion for Application No. PCT/US2014/030466 dated Sep. 15, 2015.
Non-Final Office Action for U.S. Appl. No. 14/216,331 dated Oct. 5, 2015.
Notice of Publication for European Application No. 14765237.4 dated Dec. 23, 2015.
Final Office Action for U.S. Appl. No. 14/216,331 dated Apr. 13, 2016.
Interview Summary for U.S. Appl. No. 14/216,331 dated Jul. 14, 2016.
Notice of Allowance for U.S. Appl. No. 14/216,331 dated Sep. 20, 2016.
Extended European Search Report for Application No. 14765237 dated Nov. 22, 2016.
Chinese Office Action for Application No. 2014800432978 dated Dec. 18, 2017.
Chinese Office Action for Chinese Application No. 201480027304.5 dated Mar. 7, 2018.
Office of Petitions Decision for U.S. Appl. No. 14/446,270 dated Mar. 30, 2018.
International Search Report with Written Opinion for Application No. PCT/US2014/048712 dated Jul. 29, 2014.
Communication of European Publication Application No. 14832808 dated May 11, 2016.
Chinese Office Action for Application No. 2014800273045 dated Mar. 28, 2017.
Notice of Allowance for U.S. Appl. No. 14/446,270 dated Apr. 26, 2017.
Chinese Office Action for Application No. 2014800432978 dated May 4, 2017.
Chinese Office Action for Chinese Application No. 201480043297.8 dated May 25, 2018.
European Office Action for European Application No. 14832808.1 dated May 25, 2018.
Notice of Issuance for Chinese Application No. 201480027304.5 dated Jun. 29, 2018.
International Search Report and Written Opinion for Application No. PCT/US2018/012546 dated Apr. 27, 2018.
Non-Final Office Action for U.S. Appl. No. 14/446,270 dated Feb. 25, 2016.
Interview Summary for U.S. Appl. No. 14/446,270 dated Apr. 21, 2016.
Final Office Action for U.S. Appl. No. 14/446,270 dated Aug. 10, 2016.
Advisory Action for U.S. Appl. No. 14/446,260 dated Oct. 24, 2016.
Non-Final Office Action for U.S. Appl. No. 14/446,260 dated Dec. 23, 2016.

* cited by examiner

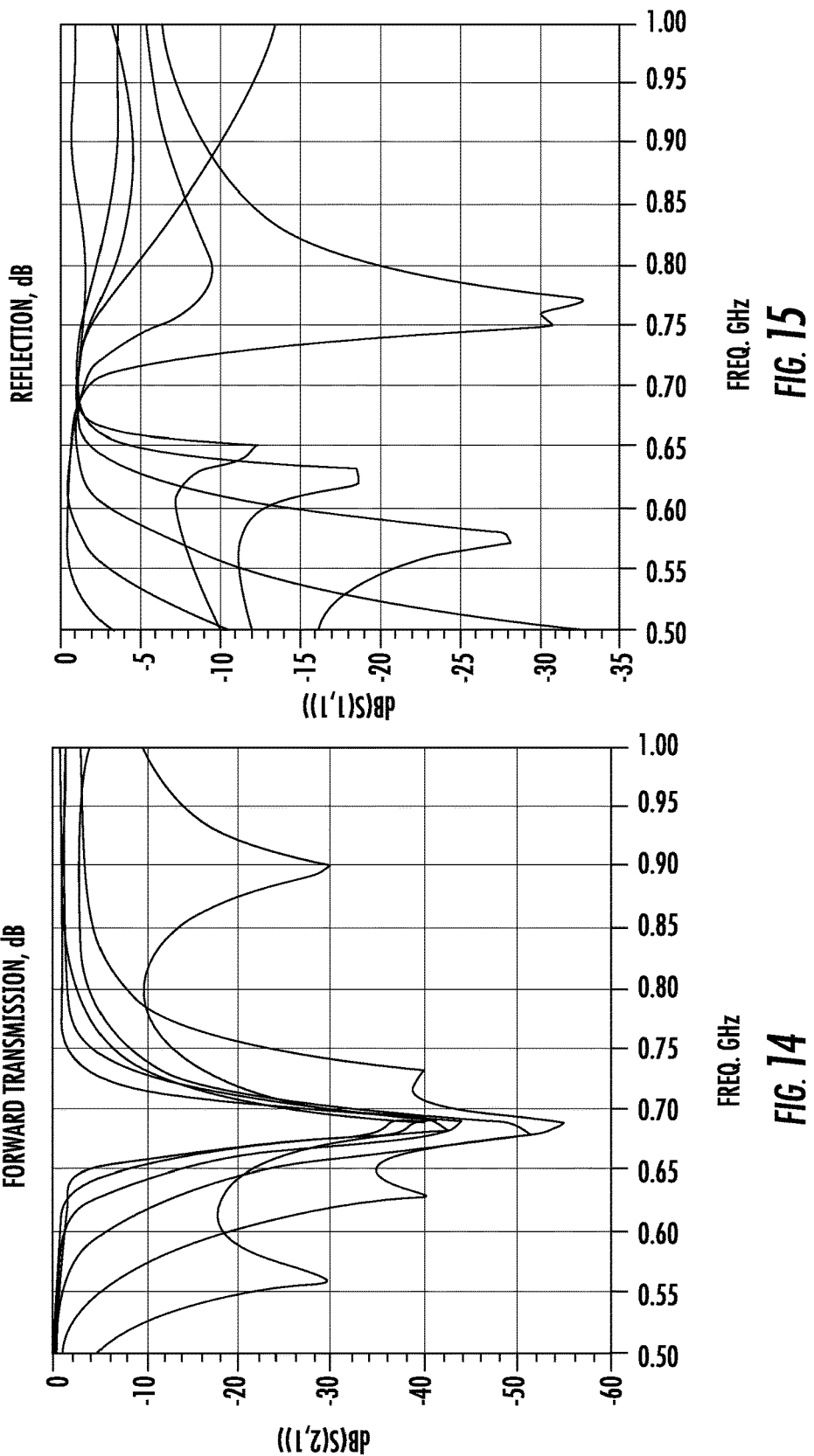

ELECTROMAGNETIC TUNABLE FILTER SYSTEMS, DEVICES, AND METHODS IN A WIRELESS COMMUNICATION NETWORK FOR SUPPORTING MULTIPLE FREQUENCY BANDS

PRIORITY CLAIM

The present application claims the benefit of U.S. Provisional Patent Application Ser. No. 61/793,089, filed Mar. 15, 2013, U.S. Provisional Patent Application Ser. No. 61/859,621, filed Jul. 29, 2013, U.S. patent Ser. No. 14/216,331, filed Mar. 17, 2014, and U.S. patent application Ser. No. 14/446,270, filed Jul. 29, 2014, the disclosures of which are incorporated herein by reference in their entirety.

TECHNICAL FIELD

The subject matter disclosed herein relates generally to electromagnetic tunable filters and methods for the fabrication thereof. More particularly, the subject matter disclosed herein relates to systems, devices, and methods for tunable filters that are configured to support multiple frequency bands, such as within the field of cellular radio communication.

BACKGROUND

In modern handheld devices for cellular communication systems (e.g. 3GPP), there is a desire to support multiple frequency bands (e.g. 3GPP LTE bands 7, 1, 2, 3, 8, 5, and 13). Due to limitations in technology and size constraints, the support of multiple frequency bands has traditionally been achieved using arrays of fixed frequency filters or duplex filters (e.g., dielectric coaxial resonator filters, SAW, BAW, FBAR) that are switched between using semiconductor switches. As used herein, the term "filter" should be understood as describing any hardware that generates a frequency selective frequency response and can discriminate between receive and transmit frequency response (e.g., greater than about 8 dB). The use of such fixed frequency filters introduces a number of limitations, however, in the design requirements of the system. For example, for each band of operation, a new set of hardware will have to be introduced. These additional hardware requirements result in the addition of filters and switches when expanding band support, with each band filter occupying additional space in the system, and each throw of the multiplex switch adding loss to the switch for each band filter.

In contrast, with recent technological development with respect to the size and performance devices of electrically tunable single resonance and multiresonance filters (e.g., RF MEMS, semiconductor-switched capacitor arrays, BST), tunable filtering systems can be used to support multiple frequency bands in a single system. Tunable systems exhibit their own problems, though. Most notably, with respect to tunable single resonance filters, the performance has not been satisfactory for some cellular systems due to the loss of the tuning resonator and the associated tradeoff between pass-band and stop-band attenuation. Conversely, tunable multiresonance filters have also been reported to have problems in that they have not been small enough, they have not had the power handling capability, or they were too complex or unrepeatable for proper integration in hand-held cellular equipment. As a result, the problem with tunable systems is to make it cost effective and small while at the same time meeting system requirements (e.g., 3GPP standards).

Furthermore, in addition to problems with the kinds of filter elements used to support of multiple frequency bands, there have also been problems with the interaction of transmitter and receiver elements in frequency division duplexing systems, with transmitter and receiver elements operating simultaneously at one or varying frequency separation. Specifically, for such frequency division duplexing, a problem known as duplex self-interference arises from the high power of the transmitter challenging the linearity of the receiver that can be setup with high gain to deal with comparatively low power reception levels.

One way to deal with these problems can be to create a spatial separation of receiver and transmitter antennas (i.e., systems where transmitter and receiver have separate antennas so some duplex isolation is created between the antennas), but such a configuration is not preferable in all systems, particularly in systems where the receiver and transmitter antennas cannot be physically spaced apart by significant distances.

Locating the transmitter and receiver antennas in close proximity introduces further equipment requirements and/or other considerations, though. For instance, for co-location of transmitter and receiver (i.e., any frequency division duplex system where the transmitter and receiver are within a certain proximity such that there can be a radiated, board, or circuit-born leakage path therebetween), a filter is required in the receive path that primarily rejects the transmit frequency to avoid overstearing or suppress intermodulation products in the receiver. For example, notch filtering at transmitter frequency in the receiver chain can be used. Similarly, a filter is required in the transmit branch that primarily rejects the transmitter noise at the receive frequency. Likewise, for co-use of the same antenna for transmitter and receiver (i.e., any system where receiver and transmitter use the same antenna element for creating a radiation), a duplex filter can be used.

In addition to providing isolation between transmission and reception signals, another issue in frequency-domain duplexing for cellular applications (e.g., LTE band application) is with bands that switch from having the reception frequency higher than the transmission frequency to having the reception frequency below the transmission frequency. For example, the majority of 3GPP standard LTE frequency-domain duplexing bands 1 to 25 have reception frequency above transmission frequency (i.e., positive duplex spacing), but bands 13, 14, 20 and 24 have the reverse order (i.e., negative duplex spacing) so that the reception frequency is below the transmission frequency. Configuring a system to allow for operation using both kinds of band spacing can further require yet additional filters and switches.

Still another issue with the location of filters in present day's phones is that filters have had a design constraint on component height of less than 1 mm so it could be placed together with RF transceiver integrated circuitry, digital processing integrated circuitry, and multimedia processing integrated circuitry.

In view of all of these problems and design considerations, it would be desirable for systems, devices, and related methods to incorporate tunable filters that can tune over a wide frequency range and at the same time minimize pass band attenuation and maximize stop band attenuation. Furthermore, it would also be desirable for such filters to change the characteristics of the filter to accommodate negative duplex spacing instead of switching between different filter hardware.

SUMMARY

In accordance with this disclosure, systems, devices, and methods for tunable filters that are configured to support multiple frequency bands, such as within the field of cellular radio communication, are provided. In one aspect, adaptive filter having an input node and an output node can comprise a first resonator connected between the input node and a signal node, a second resonator connected between the signal node and the output node, and one or more coupling elements connected between the signal node and a ground. With this arrangement, the first resonator and the second resonator can be selectively tunable to define a reject band configured to block signals having frequencies within a first signal band between the input node and the output node. and the one or more coupling elements can be selectively tunable to define a pass band configured to pass signals having frequencies within a second signal band between the input node and the output node. In particular, the one or more coupling elements can be tunable both to (1) a first mode at which a coupling impedance of the one or more coupling elements is tuned such that the pass band has a minimum pass band insertion loss at frequencies that are less than frequencies within the reject band and to (2) a second mode at which the coupling impedance of the one or more coupling elements is tuned such that the pass band has a minimum pass band insertion loss at frequencies that are greater than frequencies within the reject band.

In another aspect, a method for adjusting a tunable filter can include connecting a first resonator between an input node and a signal node, connecting a second resonator between the signal node and an output node, and connecting one or more coupling element between the signal node and a ground, wherein the first resonator, the second resonator, and the one or more coupling elements are electrically tunable. The method can further include selectively adjusting a tuning setting of one or more of the first resonator or the second resonator to define a reject band configured to block signals having frequencies within a first signal band between the input node and the output node. The method can further include selectively adjusting a tuning setting of the one or more coupling element to define a pass band configured to pass signals having frequencies within a second signal band between the input node and the output node. In particular, selective adjusting a tuning setting of the one or more coupling elements can comprise selectively tuning the one or more coupling elements among (1) a first mode at which a coupling impedance of the one or more coupling elements is tuned such that the pass band has a minimum pass band insertion loss at frequencies that are less than frequencies within the reject band and (2) a second mode at which the coupling impedance of the one or more coupling elements is tuned such that the pass band has a minimum pass band insertion loss at frequencies that are greater than frequencies within the reject band.

Although aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description, which should be read in conjunction with the accompanying drawings that are given merely by way of explanatory and non-limiting example, and in which:

FIGS. 9 through 15 each illustrate graphs of frequency responses of a tunable filter according to embodiments of the presently disclosed subject matter at a variety of tuning states;

DETAILED DESCRIPTION

The present subject matter provides systems, devices, and related methods that use tunable filters that can tune over a wide frequency range and at the same time minimize pass band attenuation and maximize stop band attenuation. Such filter systems, devices, and methods can bring down the size of a tunable solution, make it more cost efficient, and at the same time solve the issue of removing unwanted interference (e.g., from a transmitter in the wireless communication terminal). As used herein the term filter should be understood widely as any hardware that generates a frequency selective frequency response and can discriminate between receive and transmit frequency response (e.g., greater than about 8 dB).

Figure 1:
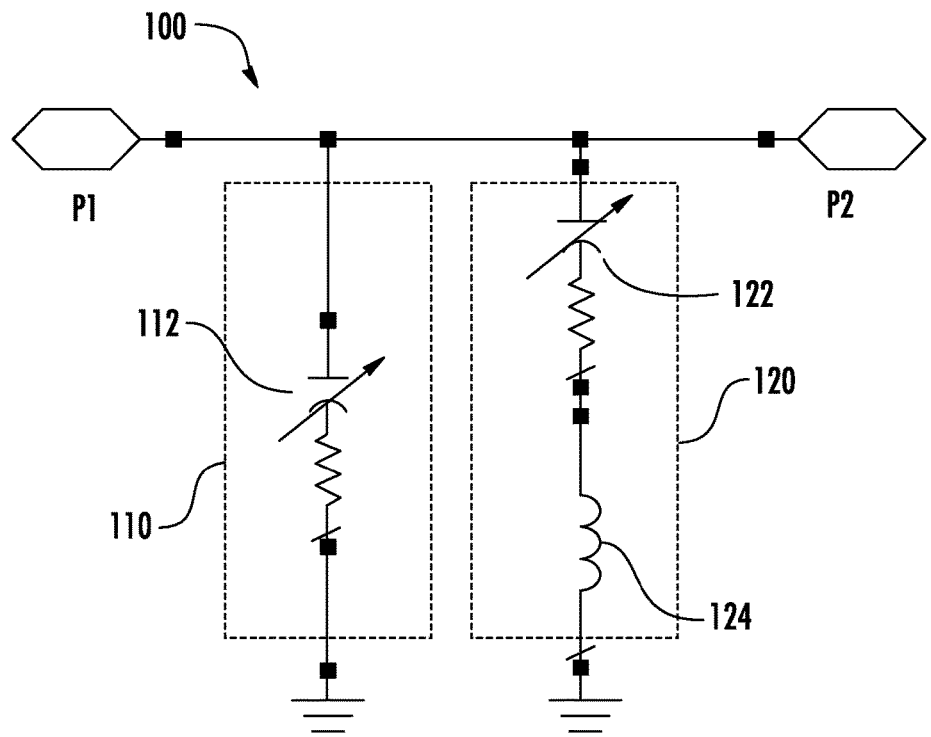
FIGS. 1 through 8 each illustrate electrical schematics of configurations of a tunable filter according to embodiments of the presently disclosed subject matter.

Specifically, in one aspect, the present subject matter provides tunable filter systems, devices, and methods in which multiple resonators can be used to block signals within one or more frequency ranges. Referring to FIG. 1 for example, one configuration for a tunable filter, generally designated 100, can include a first resonator, generally designated 110, and a second resonator, generally designated 120, connected between a first port P1 and a second port P2. In particular, in the configuration shown in FIG. 1, first resonator 110 includes a first capacitive element 112 connected between first port P1 and a ground, and second resonator 120 includes a second capacitive element 122 and a second inductive element 124 (i.e., a two-terminal conductive element characterized by its ability to store magnetic field energy by having a (varying) current running between its terminals) connected in a series arrangement between second port P2 and a ground.

Figure 4A:
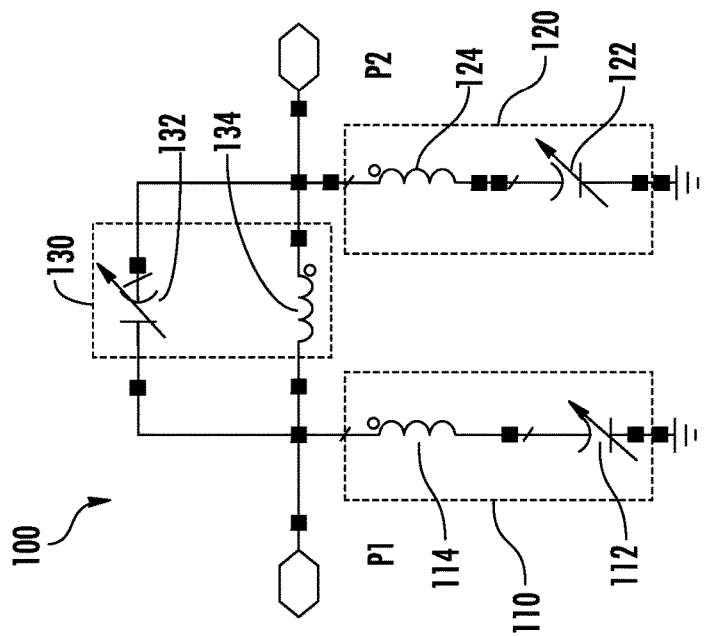
Figure 3:
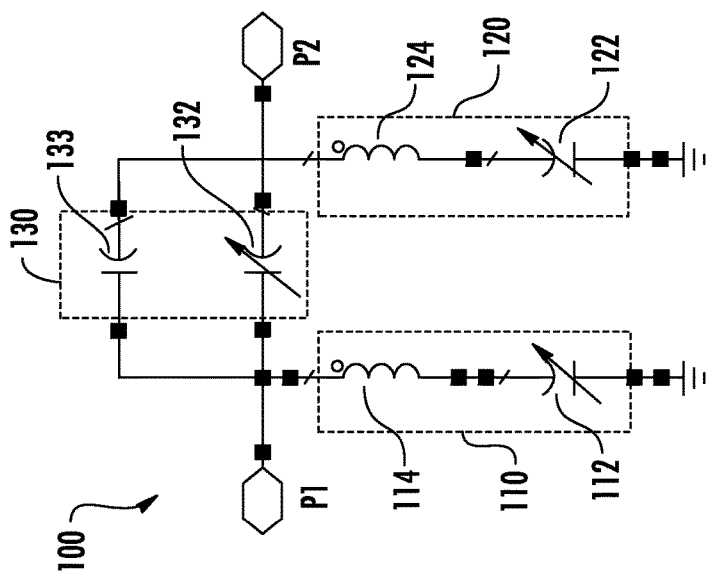
Figure 4B:
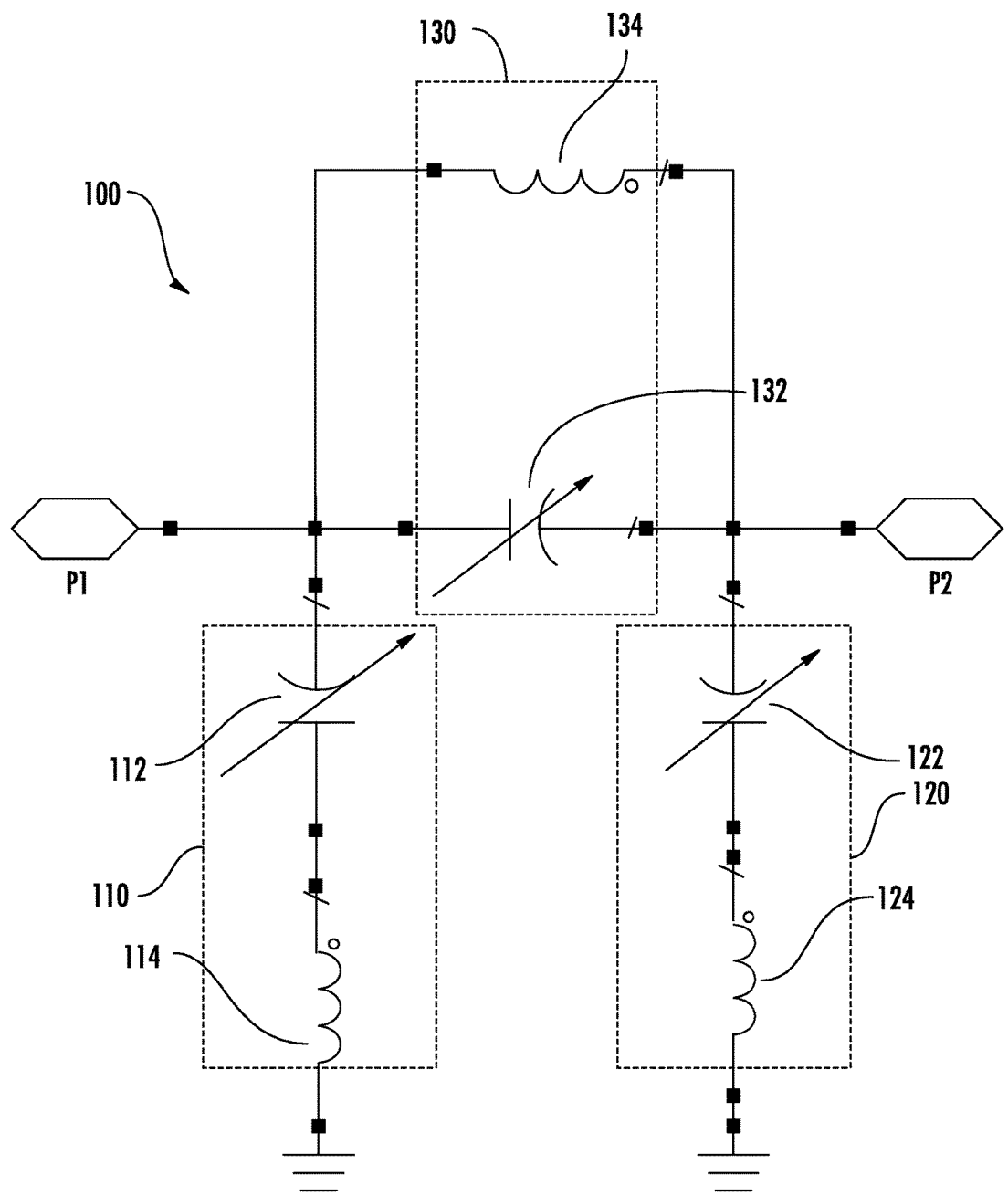
Figure 5:
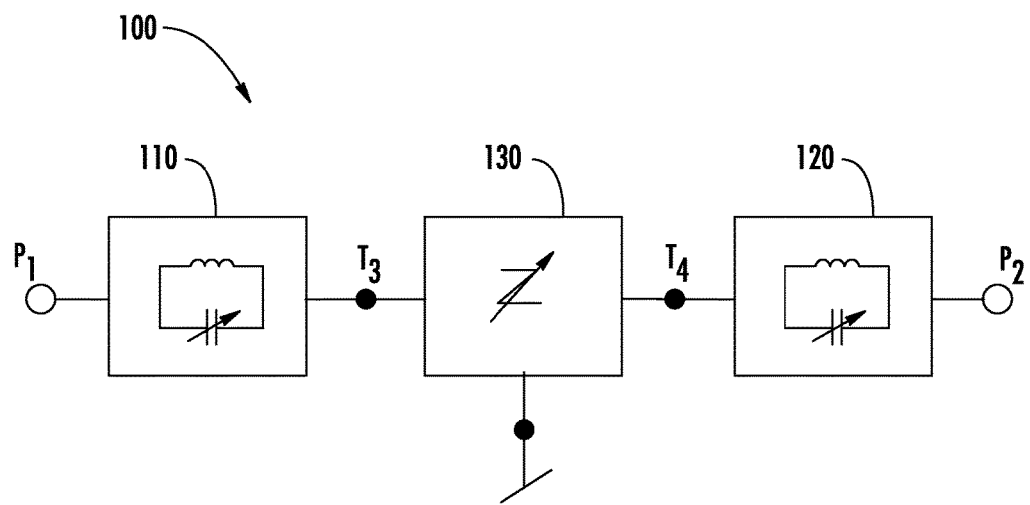

The capacitive elements (e.g., first capacitive element 112 and second capacitive element 122) can be electrically tunable capacitors. Specifically, for example, the capacitive elements of the resonators can be variable capacitors implemented using any of a variety of technologies (e.g., ferroelectric, paraelectric, MEMS, and/or solid-state technologies) such that a variable and/or switchable capacitance (e.g., between about 0.7 and 1.1 pF) is achieved by varying an electric or magnetic field. Regardless of the particular implementation of the capacitive elements, one terminal of the variable capacitor (e.g., a high parasitic side) can be connected to the terminal of the resonator that is connected to signal ground. In this configuration, tunable filter 100 can provide a notch filter with low Q tunable components that has adequate performance for cellular and wireless systems. (See, e.g., FIGS. 2A, 3, and 4A) Alternatively, one terminal of the capacitor of each of the resonators can be connected to the terminal of the resonator that is connected to the signal path (i.e., in communication with one of first port P1 or second port P2). (See, e.g., FIGS. 2B and 4B) In this configuration, an internal/direct connection can be provided in the capacitor technology substrate, although this arrangement can make the resonators more susceptible to a parasitic load from the capacitor parasitics.

The advantages of the configuration of tunable filter 100 can be extended to include both a number of resonators (i.e., two or more) discussed above as well as a number of coupling elements to combine the advantages of a coupled resonator band reject filter comprising inductive and capacitive elements. As illustrated in FIGS. 2A through 4B, for example, tunable filter 100 can again comprise first resonator 110 and second resonator 120. In particular, in each of these configurations, first resonator 110 can include a series connection of one or more capacitive element 112, which can be configured to couple an electric field, and one or more inductive element 114, which can have a fixed inductance (e.g., about 44 nH), and which can be configured to resonate with capacitive element 112. Similarly, second resonator 120 can include a series connection of one or more capacitive element 122 and one or more inductive element 124.

In addition to these components, however, in the configuration shown in FIGS. 2A through 4B, tunable filter 100 can further comprise one or more coupling element 130, which can provide low insertion loss (e.g., less than about 5-7 dB) within a pass band. Coupling element 130 can be provided in any of a variety of configurations, but with each case comprising at least an impedance element with two terminals that is connected by a conductive material to a signal node of both of first resonator 110 and second resonator 120 so as to create coupling between the resonators. Specifically, for example, with coupling element 130 in connection between first resonator 110 and second resonator 120, a total pass band loss in tunable filter 100 can be less than about 5-7 dB at the desired duplex frequency (e.g., for a filter in a receive signal path, a pass band loss of less than about 5-7 dB at the receive frequency). In addition, coupling element 130 can provide simultaneous conjugate impedance matching to the impedance at first resonator 110 and at second resonator 120. Specifically, by programming the impedance of coupling element 130, the frequency at which the simultaneous conjugate match occurs can be altered, which can thereby alter the frequency of the passband.

By changing the form of coupling element 130, the response of tunable filter 100 can be adjusted as desired. Specifically, in some embodiments, for example, the impedance element of coupling element 130 includes a capacitive element. In particular, the impedance element of coupling element 130 can include a variable capacitor, with changes in the capacitance (e.g., between about 0.7 and 2.8 pF) being achieved by varying an electric or magnetic field (e.g. a MEMS capacitor). In contrast, in some embodiments, the impedance element of coupling element 130 includes an inductive element (i.e., characterized by its ability to store magnetic field energy by having a (varying) current running between its terminals). In some embodiments, the inductive element of coupling element 130 can have a fixed inductance (e.g., about 20 nH). Alternatively or in addition, in some embodiments, coupling element 130 can be a variable impedance element configured for changing the coupling impedance by varying an electric or magnetic field.

Figure 2A:
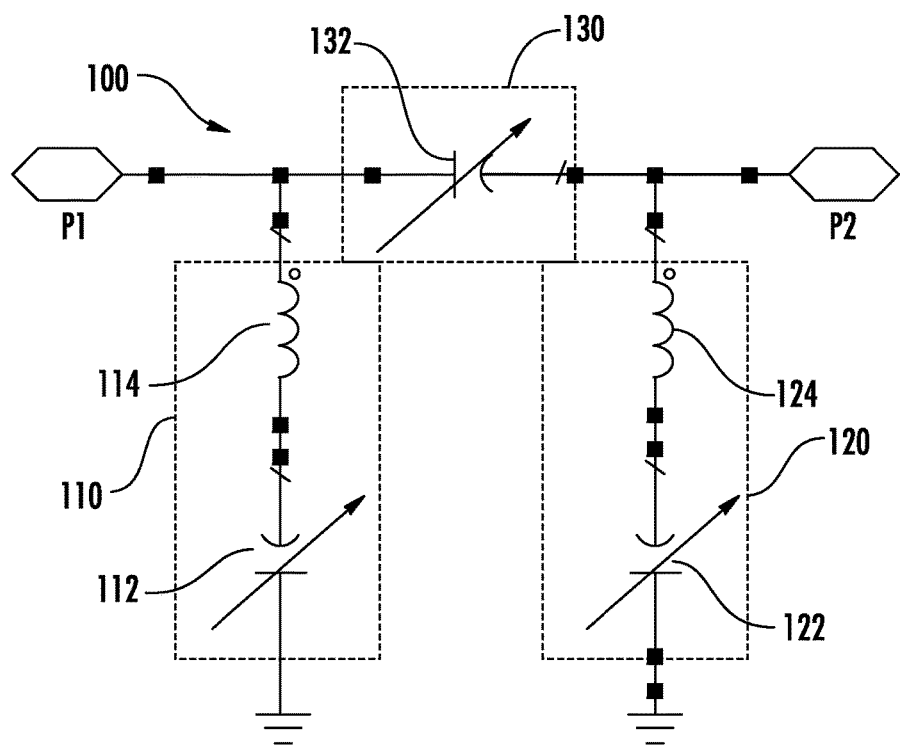
Figure 2B:
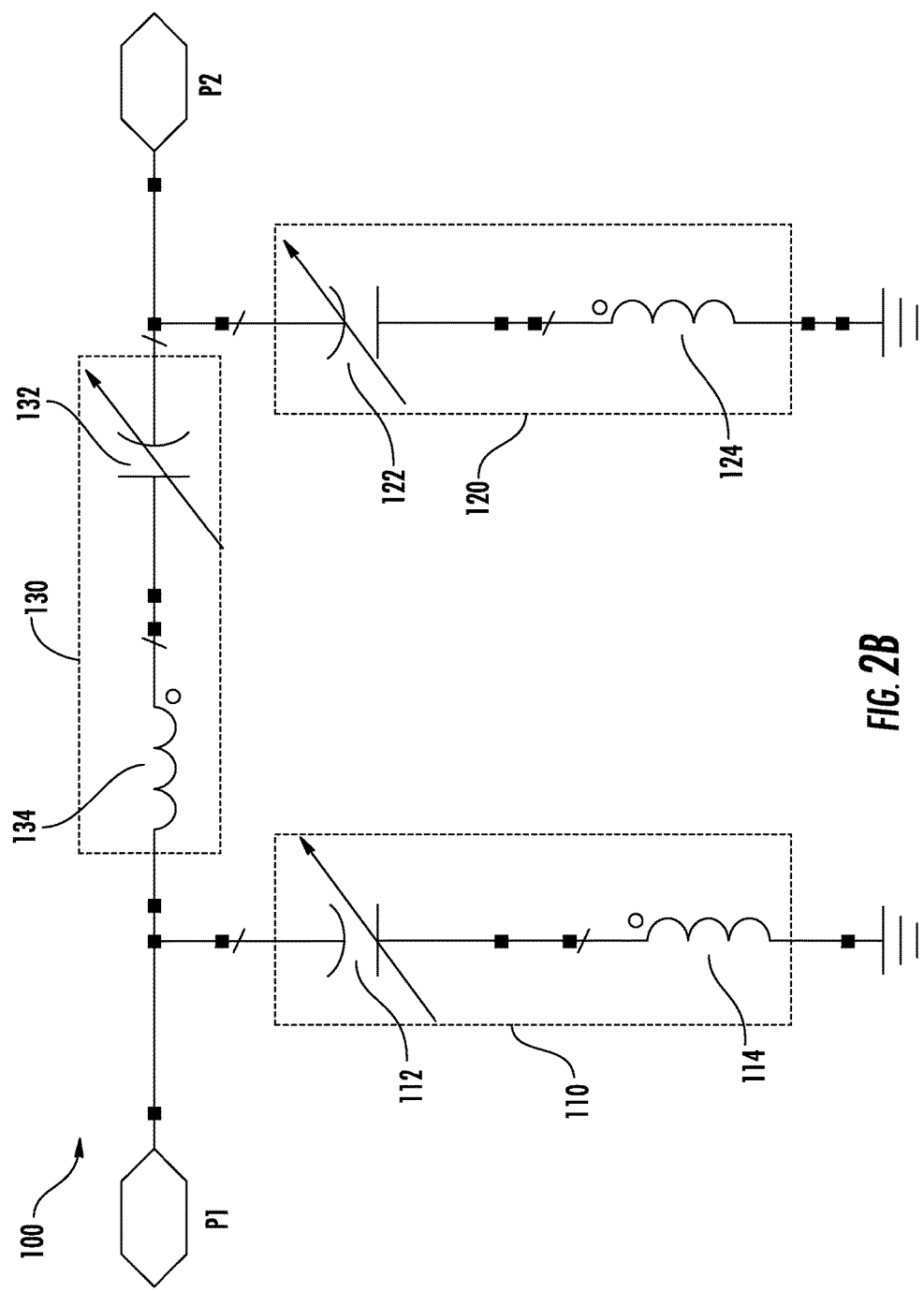

In the particular configuration shown in FIG. 2A, for example, coupling element 130 comprises a first coupling capacitive element 132 connected between first port P1 and second port P2. As shown in FIG. 2B, a coupling inductive element 134 can be provided in series with first coupling capacitive element 132 between first port P1 and second port P2. In this arrangement, a combined impedance response of the series connected inductive and capacitive elements can in majority be equal to the impedance response known from a series LC circuit and as such can have a low impedance at resonance. Alternatively, the configuration shown in FIG. 3 further comprises a second coupling capacitive element 133 connected in parallel with first coupling capacitive element 132. In yet further alternative arrangements, the configuration shown in FIGS. 4A and 4B include coupling inductive element 134 connected in parallel with first coupling capacitive element 132. In such a configuration, coupling element 130 can be have an impedance function in majority equivalent to a parallel LC circuit having high impedance at resonance. In addition, first coupling capacitive element 132 can be a variable capacitor (e.g. a MEMS variable capacitor), where the inductance of coupling inductive element 134 can be effectively tuned by adjusting the capacitance of first coupling capacitive element 132.

In any of these exemplary configurations, the filter notch or reject band frequencies can be controlled by tuning one or both of first capacitive element 112 or second capacitive element 122. Further, the pass band characteristics can be determined by the configuration of inductive elements and capacitive elements in coupling element 130, with these characteristics being programmable by tuning the value of first coupling capacitive element 132. In configurations in which coupling element 130 includes both inductive and capacitive elements (See, e.g., FIGS. 2B, 4A, and 4B), the combined impedance of those elements can be selectively either primarily inductive or primarily capacitive at the desired bands of operation (i.e., RX and TX frequency). In this regard, the inductance value and tuning range of capacitance of coupling element 130 can be configured such that the combined impedance can selectively be turned either inductive (e.g., $C=C_{min}$) or capacitive (e.g., $C=C_{max}$) at the signal pass band. Stated otherwise, in some embodiments, $1/\omega C_{min}$ can be greater than $r \cdot \omega L$, and $1/(\omega C_{max})$ can be less than $1/\cdot \omega L$, where $\omega$ is the signal pass band frequency, L is the inductance value, $C_{max}$ is the maximum tunable capacitance, $C_{min}$ is the minimum tunable capacitance, and r is a constant larger than 1 (e.g., 1.33).

Furthermore, the impedance elements can be capable of making a variable frequency response between the input (i.e., first port P1) and the output (i.e., second port P2). In this way, the pass band and matching can be moved relative to the notch frequency. In fact, in some embodiments, the pass band can be moved to either side of the notch, thereby allowing both positive and negative frequency duplex spacings. In any tuning state, however, tunable filter 100 can still be configured to minimize a total pass band loss (e.g., total loss of less than about 5-7 dB) and maximize a reject band attenuation (e.g., attenuation of more than about 15-18 dB) at corresponding duplex frequencies.

In a series of alternative configurations shown in FIGS. 5 through 8, tunable filter 100 can again comprise a first resonator 110 in communication with a first port P1, a second resonator 120 in communication with a second port, and one or more coupling element in communication with both of first resonator 110 and second resonator 120. In contrast with the previous configurations discussed above, however, tunable filter 100 according to the embodiments shown in FIGS. 5 through 8 can be configured such that first resonator 110 and second resonator 120 are connected in a series arrangement between first port P1 and second port P2, and one or more coupling element 130 is connected to a node between the series connection of first resonator 110 and second resonator 120.

In this general arrangement, first resonator 110 can provide maximum isolation at the notch frequency between first port P1 and a third terminal T3. Similarly, second resonator 120 can provide maximum isolation at the notch frequency between a fourth terminal T4 and second port P2. In some embodiments, for example, the reject band attenuation can be more than about 15-18 dB. Between third terminal T3 and fourth terminal T4, coupling element 130 serves as a variable impedance network to optimize total power transfer between first port P1 and second port P2 at the desired pass band frequency (e.g., pass band loss of less than about 5-7 dB). The frequency of the resonators and of the coupling element can be varied by controlling and electric or magnetic field (e.g., as in MEMS devices, semiconductor switched impedance networks, or field modulated dielectrics (BST)).

Figure 6:
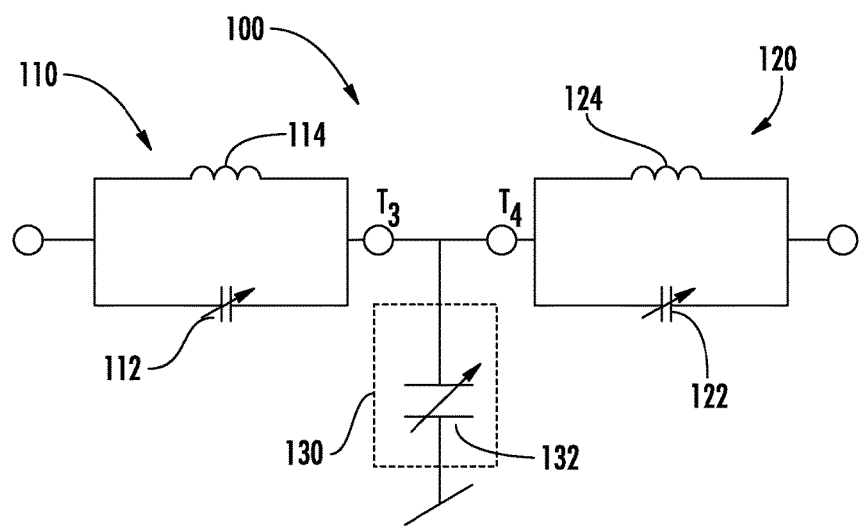
Figure 7:
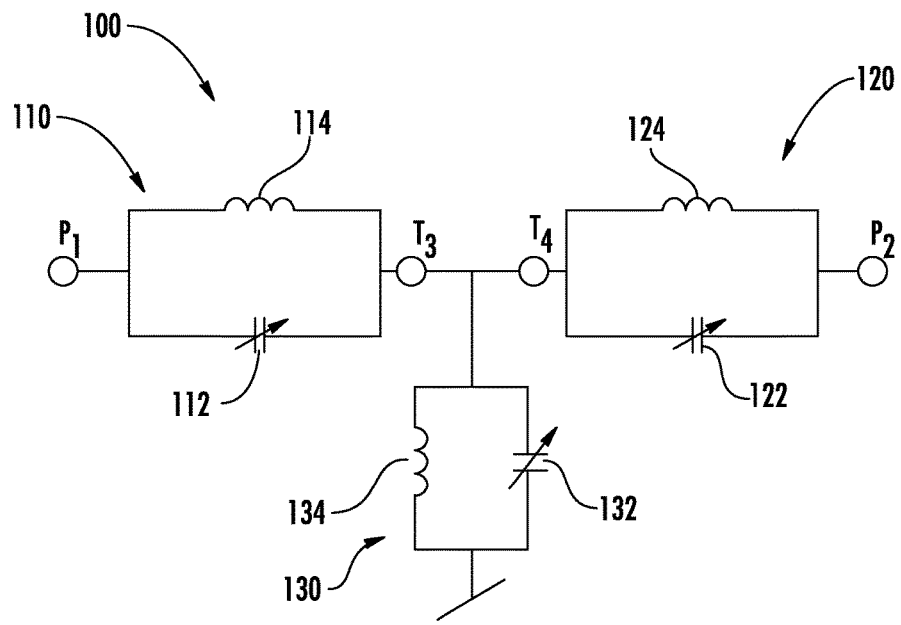
Figure 8:
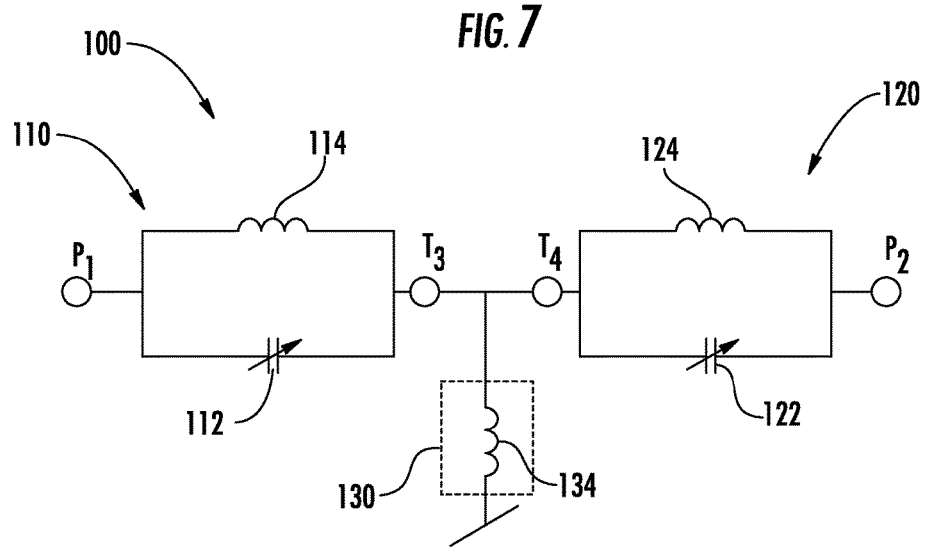

Regarding the particular arrangements of elements in these configurations, each of FIGS. 6 through 8 illustrate configurations of tunable filter 100 in which first resonator 110 includes a first capacitive element 112 and a first inductive element 114 connected in parallel with each other between first port P1 and third terminal T3. Similarly, second resonator 120 includes a second capacitive element 122 and a second inductive element 124 connected in parallel with each other between fourth terminal T4 and second port P2. The particular configurations shown in FIGS. 6 through 8 differ, however, in the particular arrangement of coupling element 130. In particular, for example, coupling element 130 in the configuration illustrated in FIG. 6 includes a single coupling capacitive element 132 (e.g., a tunable capacitor) that is connected between a signal node of both of first resonator 110 and second resonator 120 (i.e., in communication with both of third terminal T3 and fourth terminal T4) and a ground. In the configuration illustrated in FIG. 7, coupling element 130 includes a coupling capacitive element 132 (e.g., a tunable capacitor) and a coupling inductive element 134 connected in parallel with one another between the signal node and ground. In FIG. 8, coupling element 130 is illustrated as including a single coupling inductive element 134 connected between the signal node and ground.

Regardless of the particular configuration of tunable filter 100, one or more of first resonator 110, second resonator 120, and/or coupling element 130 can be electrically tunable (e.g., by using variable or switchable capacitors). In this way, tunable filter 100 can provide a variable frequency distance between pass- and reject-bands while still having a small size compared to conventional filter configurations for use in cellular and wireless handheld components. Furthermore, the inclusion of coupling element 130 allows tunable filter 100 to provide a notch filter with tunable capacitors, even in configurations where the tunable capacitors exhibit high levels of parasitic capacitance to the signal ground. Furthermore, in some embodiments, the tunable reject band characteristics and tunable pass band characteristics enable tunable filter 100 to be programmed such that minimum pass band insertion loss can be either at the higher-frequency-side of the reject band or at the low-frequency-side of the reject band.

This functionality makes tunable filter 100 well suited for use in a wireless communication system, such as in a cellular communication system. In particular, tunable filter 100 can be used in the mobile terminal of a cellular communication system, such as in the transmission path or in the reception path of a mobile terminal having separate antennas and branches for reception and transmission. When used in a wireless communication system, tunable filter 100 can be tuned for operation in any of a variety of frequency bands.

Figure 9:
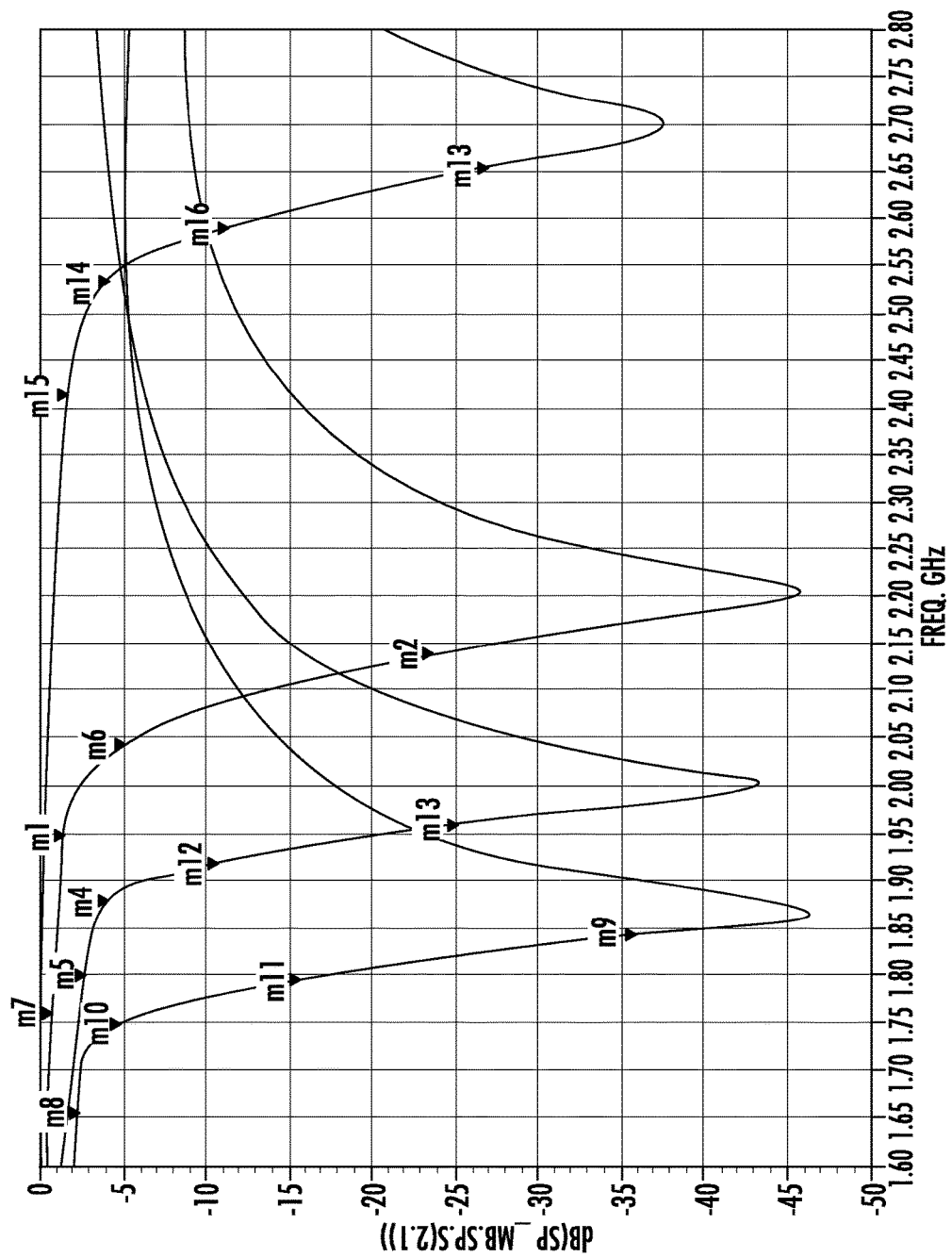
Figure 10:
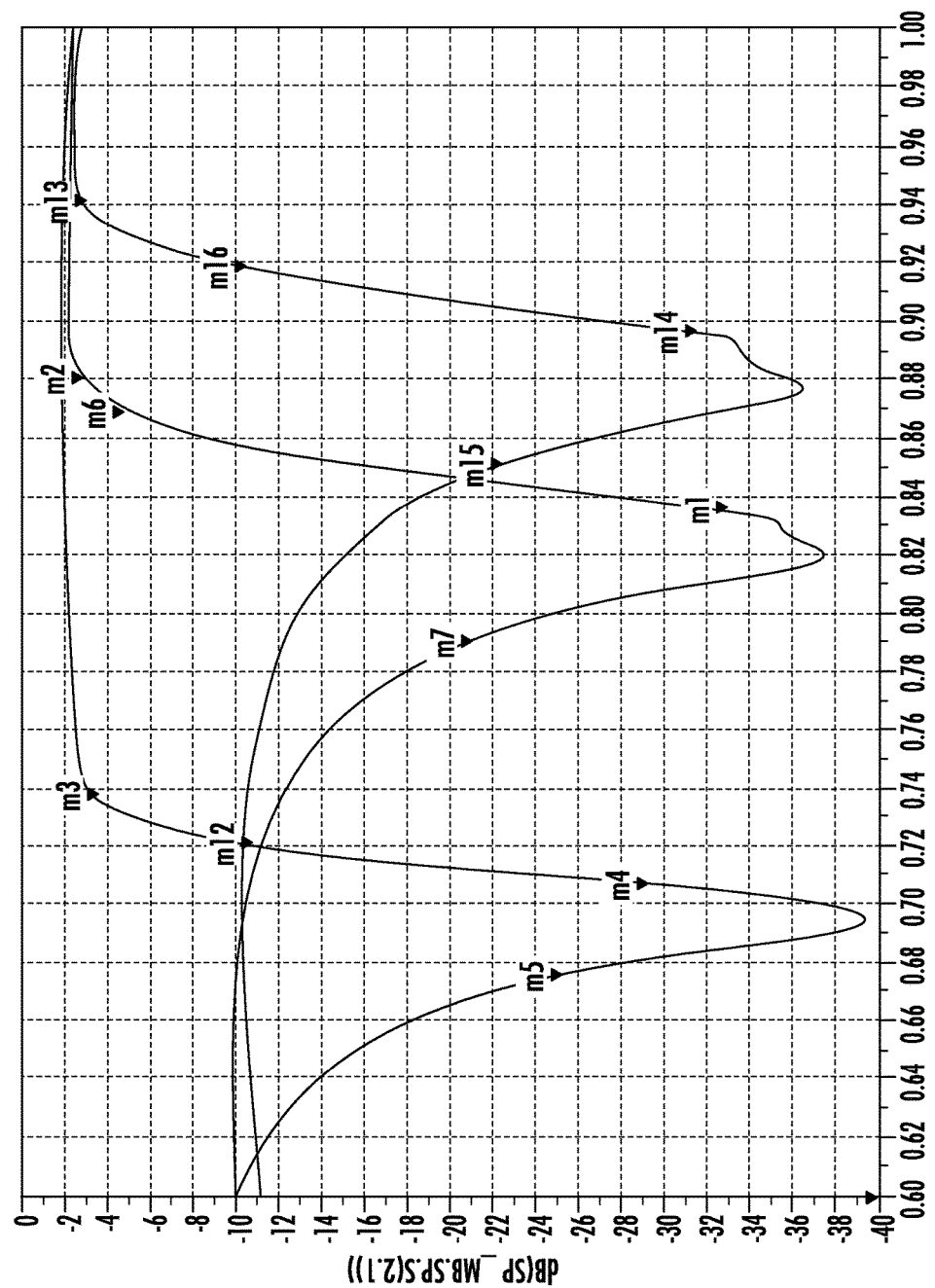
Figure 11:
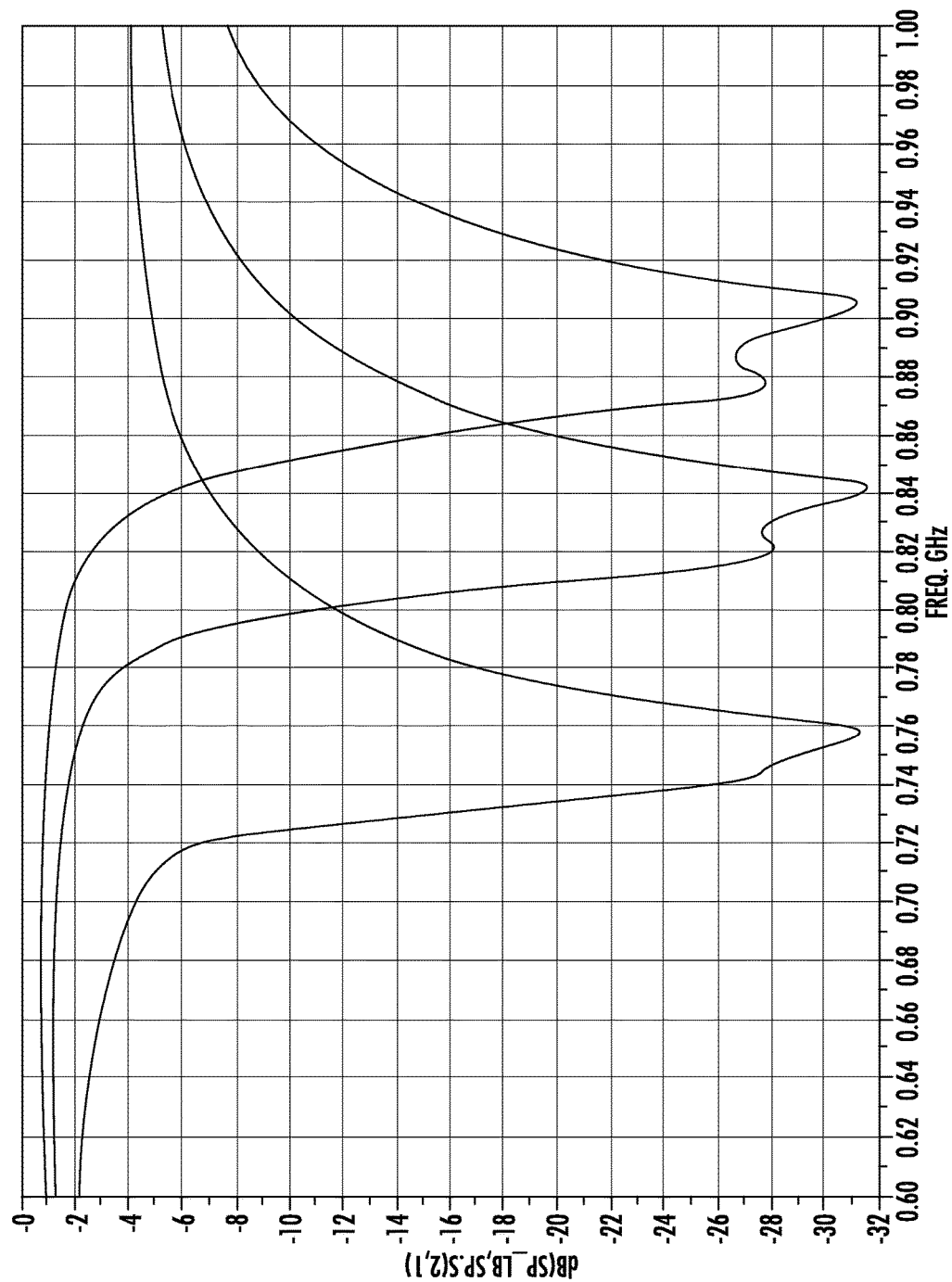
Figure 12:
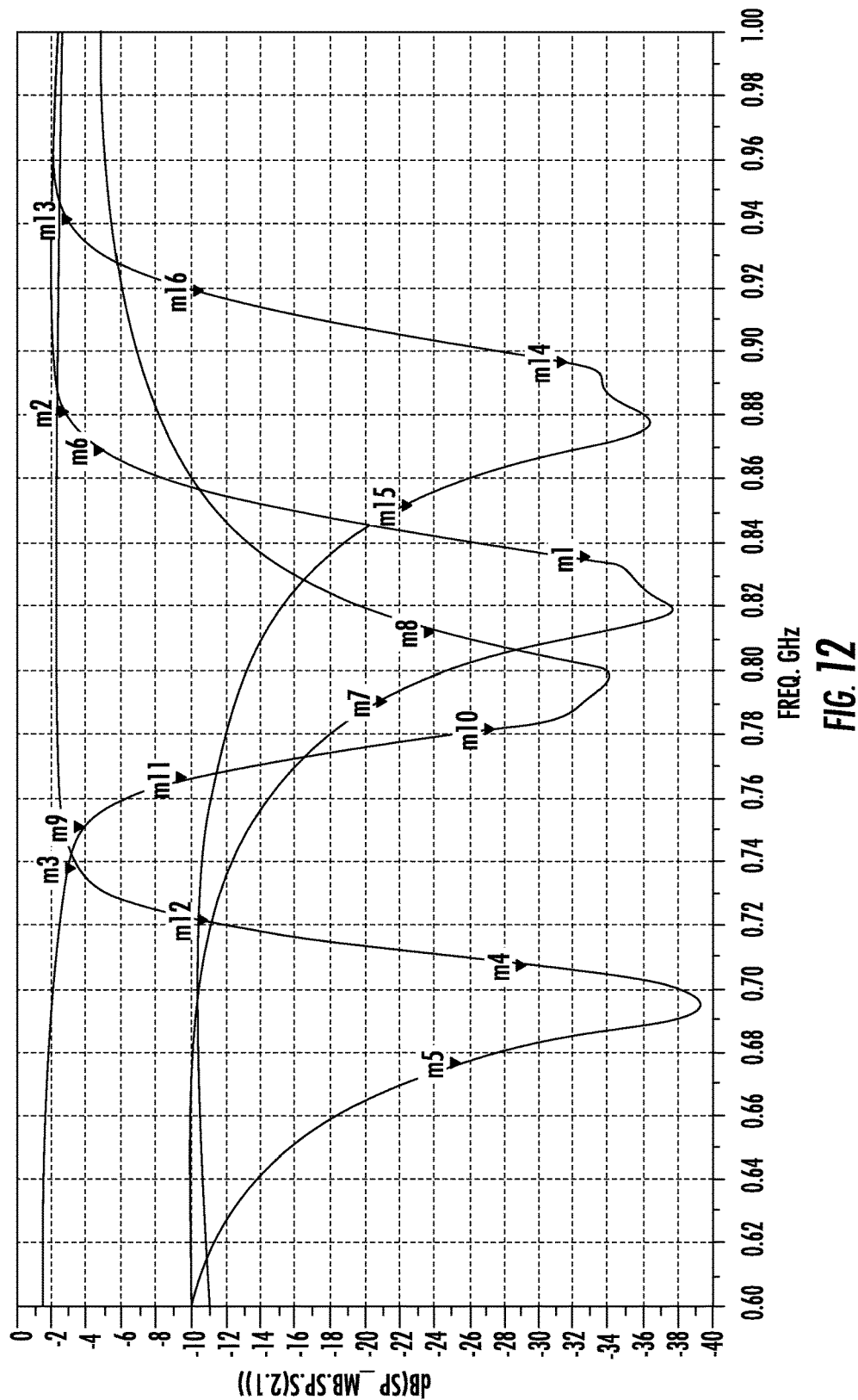

In particular, for example, FIG. 9 shows a frequency response of tunable filter 100 when used in 3GPP LTE band number 3 (curve including measurements m8, m9, m10, and m11), band number 2 (curve including measurements m4, m5, m12, and m13), band number 1 (curve including measurements m1, m2, m6, and m7), and band number 7 (curve including measurements m13, m14, m15, and m16). FIG. 10 illustrates examples of frequency responses of tunable filter 100 when operating as a tunable receive (RX) filter for positive duplex spacing in 3GPP LTE band number 12 (curve including measurements m3, m4, m5, and m12), band number 5 (curve including measurements m1, m2, m6, and m7), and band number 8 (curve including measurements m13, m14, m15, and m16). FIG. 11 illustrates examples of frequency responses of tunable filter 100 when operating as a tunable RX filter for negative duplex spacing. FIG. 12 illustrates examples of frequency responses of tunable filter 100 when operating as a tunable RX filter for both positive duplex spacing in 3GPP LTE band number 5 (curve including measurements m1, m2, m6, and m7), band number 8 (curve including measurements m13, m14, m15, and m16), and band number 12 (curve including measurements m3, m4, m5, and m12), and negative duplex spacing in 3GPP LTE band number 13 (curve including measurements m8, m9, m10, and m11).

Thus, to achieve these complex modes of tuning, the function of the one or more of tunable filter 100 can be to define tunable reject band characteristics and tunable pass band characteristics. Specifically, tunable filter 100 can be configured to be tunable such that a minimum pass band insertion loss can be programmed to be at either of a higher frequency side of the reject band when in a first duplexing mode or a lower frequency side of the reject band when in a second duplexing mode. To put this functionality in context, for example, where tunable filter 100 is incorporated into a receive signal path, it can be tunable such that a pass band is provided at frequencies above the reject band (i.e., "positive" duplex spacing, such as is shown in FIG. 10) or at frequencies below the reject band (i.e., "negative" duplex spacing, such as is shown in FIG. 11). Specifically, tunable filter 100 can be configured to have a total path band loss of less than 7 dB and a reject band attenuation of more than 18 dB at corresponding duplex frequencies. (i.e., if the filter is a receive filter, it can have pass band loss of less than 7 dB at the receive frequency and have attenuation at the transmit frequency of more than 18 dB)

Figure 13:
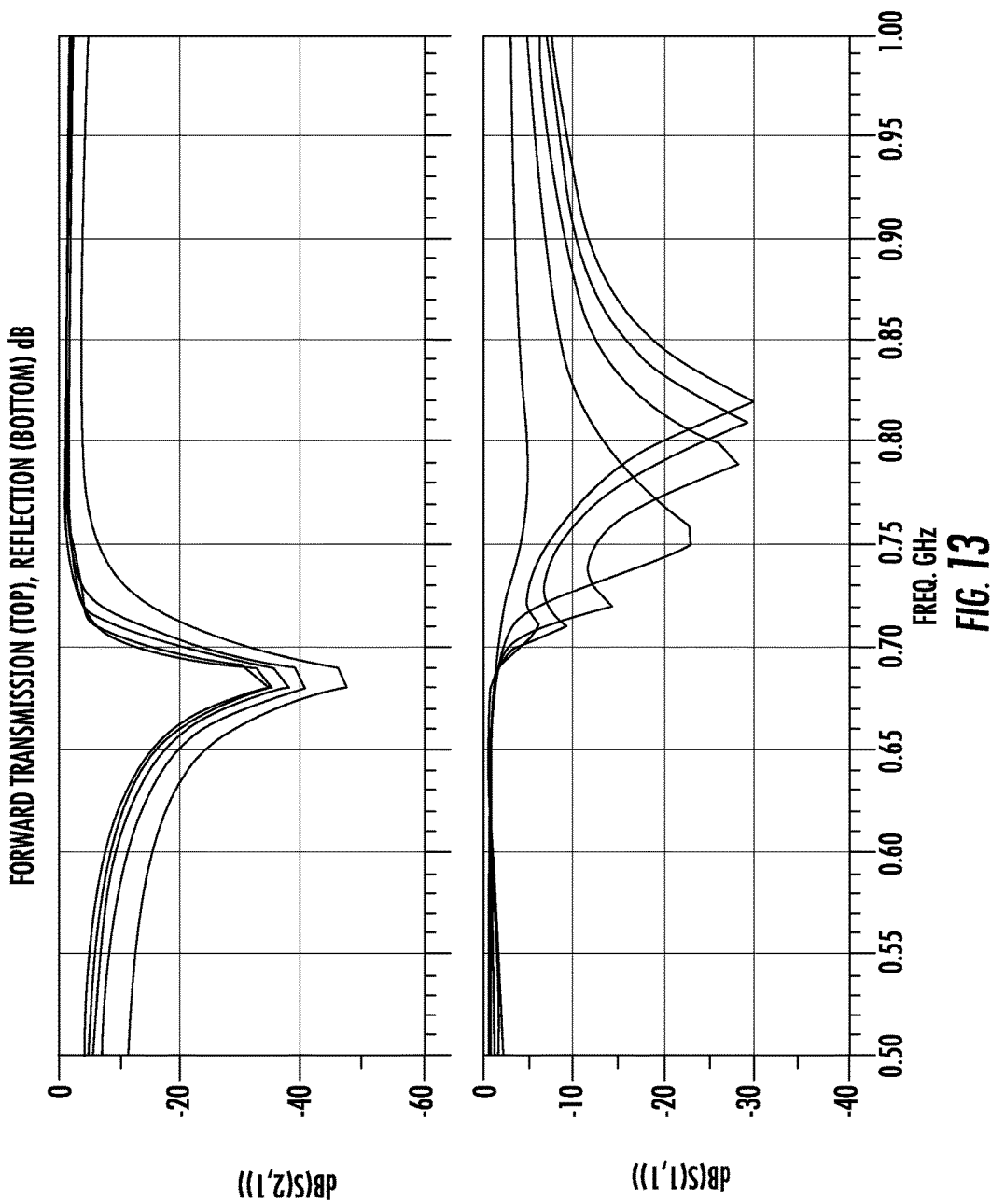

Tunable reject band characteristics can be monitored as a change of notch frequency in the S21 transmission characteristics. Likewise, tunable pass band characteristics can be seen in the S21 transmission, but the pass band is more significantly monitorable with respect to a moving notch or notches (i.e., reject band) in the S11 reflection characteristics. Both curves are illustrated in FIG. 13, which shows examples of pass band tuning for fixed notch frequency setting (S21 transmission at top and S11 reflection at bottom). It is noted that the pass band tuning is most noticeable in its reflection response. In this regard, FIGS. 14 and 15 illustrate example embodiments of pass band tuning for a fixed notch frequency setting. In particular, FIG. 14 illustrates S21 transmission, and FIG. 15 illustrates S11 reflection. With respect to these exemplary frequency responses, it is noted that tuning the value of a capacitance in coupling element 130 (e.g., capacitance value of first capacitance element 132 discussed above with respect to the embodiments illustrated in FIGS. 2A-4B, 6, and 7) can move the pass band and matching frequency from a higher frequency to a lower frequency (e.g., from right to left in FIGS. 14-15) as the capacitance increases, which can move the pass band from one side of the transmission notch to the other side of the transmission notch. In this way, tunable filter 100 can be operable to provide a desired filter response in both "positive" and "negative" duplexing modes. (See, e.g., FIG. 12)

Regarding the implementation of the individual elements of tunable filter 100, the capacitive elements (in either resonator and/or in the coupling element) can comprise variable capacitors as discussed above. Such variable capacitor can be controlled by varying and electric field or current. In some embodiments, the variable capacitors are produced using semiconductor technology like CMOS, SOI (Silicon On Insulator), PHEMT, micro-electro-mechanical systems (MEMS) technology, or tunable ceramics (e.g., BST). In this regard, adjusting the capacitance of such variable capacitors can be achieved using electro mechanical actuation (e.g. MEMS), or electric field actuation (e.g., pin diodes, tunable dielectrics like BST). Alternatively, the capacitances can be adjusted using electrical semiconductor switches connected to an array of capacitances. In such an arrangement, the electrical semiconductor switches can be based on voltage field switching (e.g., PHEMT, JFET, CMOS) or current switching (e.g., bipolar transistors like GaAs HBT). In some embodiments, the variable capacitances can be programmable either using serial bus (e.g., SPI, RFFE, I2C) or programmable registers that control the capacitance value of the variable capacitor through semiconductor devices (e.g., transistors, gates, ADC's). In such programmable configurations, the variable capacitances can be programmable to an integer number of discrete capacitance settings. For example, the variable capacitances can be programmable according to a binary weighting scheme, or they can be programmable according to a linearly weighting scheme.

The inductive elements (in either resonator and/or in the coupling element) can be implemented with loops (i.e., turns) of conductive material in a way that the loops share the same magnetic field like with wound helical inductors, wound squared helical inductors, planar inductors, multi-layer planar inductors (e.g., thin or thick film inductors), or vertical inductors in planar technologies. In some embodiments, for example, the inductive elements can have an outer conductor turns diameter or effective conductor winding aperture (e.g., x, y) that is larger than about 0.7 mm. Alternatively, the inductive elements can be implemented using a number of turns of a single piece of wound wire of conductive material (e.g., copper, aluminum, gold, silver). In a further alternative, the inductive elements can be implemented using loops of bond wire by the use of wire bond technology (e.g., to form a helix-like structure). In some embodiments, the inductive elements can be implemented as a ladder inductor using mechanically shaped, etched, printed, or laser direct structuring (LDS) structures. With particular reference to inductive elements used in the resonators, the inductive elements can be implemented using a section of dielectric (e.g., ceramic) coax (e.g., squared or circular). In other embodiments, the inductive elements can be SMD/SMT components that are manufactured for use with SMD/SMT soldering processes.

Regardless of the particular form of the inductive elements, first resonator 110 and second resonator 120 can be configured such that magnetic coupling between the inductive elements of each is reduced. Specifically, for example, the inductive elements of each resonator can be separated as far as possible from each other. Alternatively or in addition, the inductive elements can be placed at an angle close to 90 degrees (i.e., between about 45 deg and 135 deg) so as make the magnetic field of the two inductive elements as orthogonal as possible to further reduce the magnetic coupling between the resonators.

Furthermore, in some embodiments, a first conductor connecting from first resonator 110 to a first terminal of coupling element 130 can be arranged such that it is substantially perpendicular to a second conductor connecting from second resonator 120 to a second terminal of coupling element 130 to minimize coupling between input and output. In addition, in some embodiments, a third conductor connecting from first port P1 to the first terminal of coupling element 130 can be substantially perpendicular to a fourth conductor connecting from second port P2 to the second terminal of coupling element 130 so as to minimize coupling between the input and output. Further regarding the arrangement of these elements, the shared path of the first and third conductors (and the shared path of second and fourth conductors) can have an impedance due to its electrical length that it is less than the impedance of a coupling capacitive element 132 at the frequencies of operation (i.e., at signal and reject frequencies). This ensures a low pass band loss (e.g., less than about 5-7 dB) and a corresponding high reject band isolation (e.g., attenuation of more than about 15-18 dB).

Further regarding the implementation of tunable filter 100, it can be implemented into a module or onto a printed circuit board or printed wire board. For example, tunable filter 100 can be implemented using module technology characterized by having a common carrier (e.g., a wafer as used for planar circuit semiconductors, such as a silicon wafer; a wafer as used for processing MEMS devices; or a "strip" that is commonly used for packaging and modules, where this strip can be manufactured using package laminate processing, Printed Circuit Board (PCB) technology, or build up board processing) in which components of multiple modules are integrated or mounted and interconnected. The modules can be singulated by dividing the common carrier (e.g., using SAW or routing) into individual modules, while prior to the singulation the modules can be over molded or by other means enclosed to either shield or create a regular top surface. In some embodiments, such a circuit can use connections of solder balls, solder paste, and/or wire bonding. In some embodiments, the capacitive elements (e.g., first capacitive element 112, second capacitive element 122, first coupling capacitive element 132, second coupling capacitive element 133) can all be constructed in a single fabrication flow. For example, the capacitive elements can all reside on a common substrate (e.g., a semiconductor die). Similarly, in some embodiments, the inductive elements and capacitive elements can be assembled and connected in a module or other hybrid assembly. In addition, connection points can be provided to which external inductors can be connected to complete the tunable filter frequency characteristics. In some embodiments, the inductive elements and capacitive elements can be mounted on the same side of a given circuit laminate, or the inductive elements and capacitive elements can be mounted on opposite sides of the circuit laminate. In a further alternative, the inductive elements can be mounted on an edge of the circuit laminate (e.g., for edge mounting). In any arrangement, the circuit laminate can be further soldered to a system printed circuit board that connects multiple modules (e.g., PA, filters, transceivers, power supplies), and such a system printed circuit board can be part of a cellular phone or modem.

Regarding the particular physical configuration of tunable filter 100 within a cellular phone, for example, one or more of tunable filter 100 can be incorporated in a phone such that a greater relative height of tunable filter 100 (e.g., higher than 1 mm) can be allowed, thereby allowing resonator components in tunable filter 100 to be likewise higher. This additional clearance can be desirable at frequencies below 1 GHz to achieve a high enough Q for tunable filters. Accordingly, the implementation of tunable filter 100 can provide a combined solution that makes it acceptable to place tunable filter 100 in a location on the phone board that allows higher building height (e.g., having a height that exceed about 1.0 mm), therefore allowing the use of higher-diameter inductors to increase inductor Q and thereby make tunable frequency filter characteristics acceptable to system requirements.

Figures 16, 17:
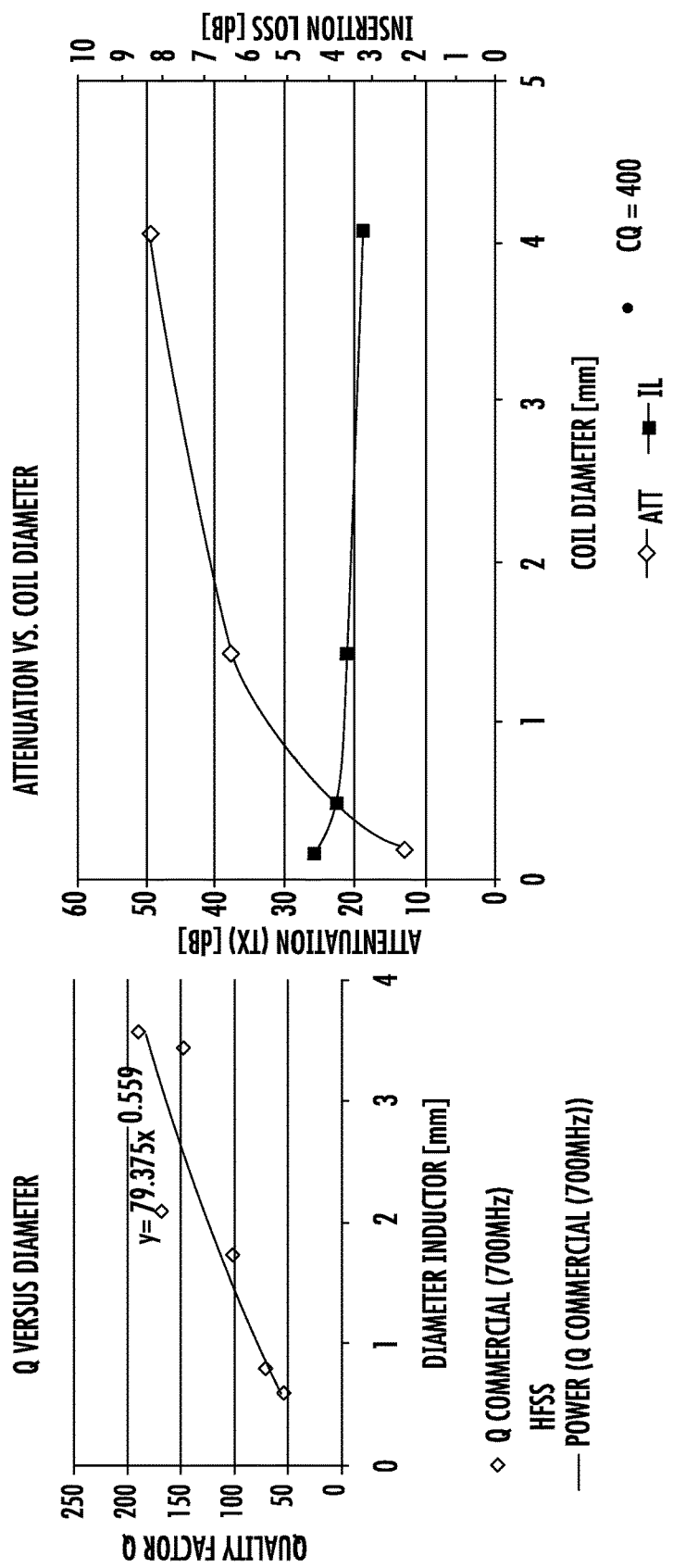
FIG. 16 is a graph of inductor Q vs. inductor diameter of a tunable filter according to an embodiment of the presently disclosed subject matter.
FIG. 17 is a graph of attenuation vs. inductor coil diameter of a tunable filter according to an embodiment of the presently disclosed subject matter.
Figure 18:
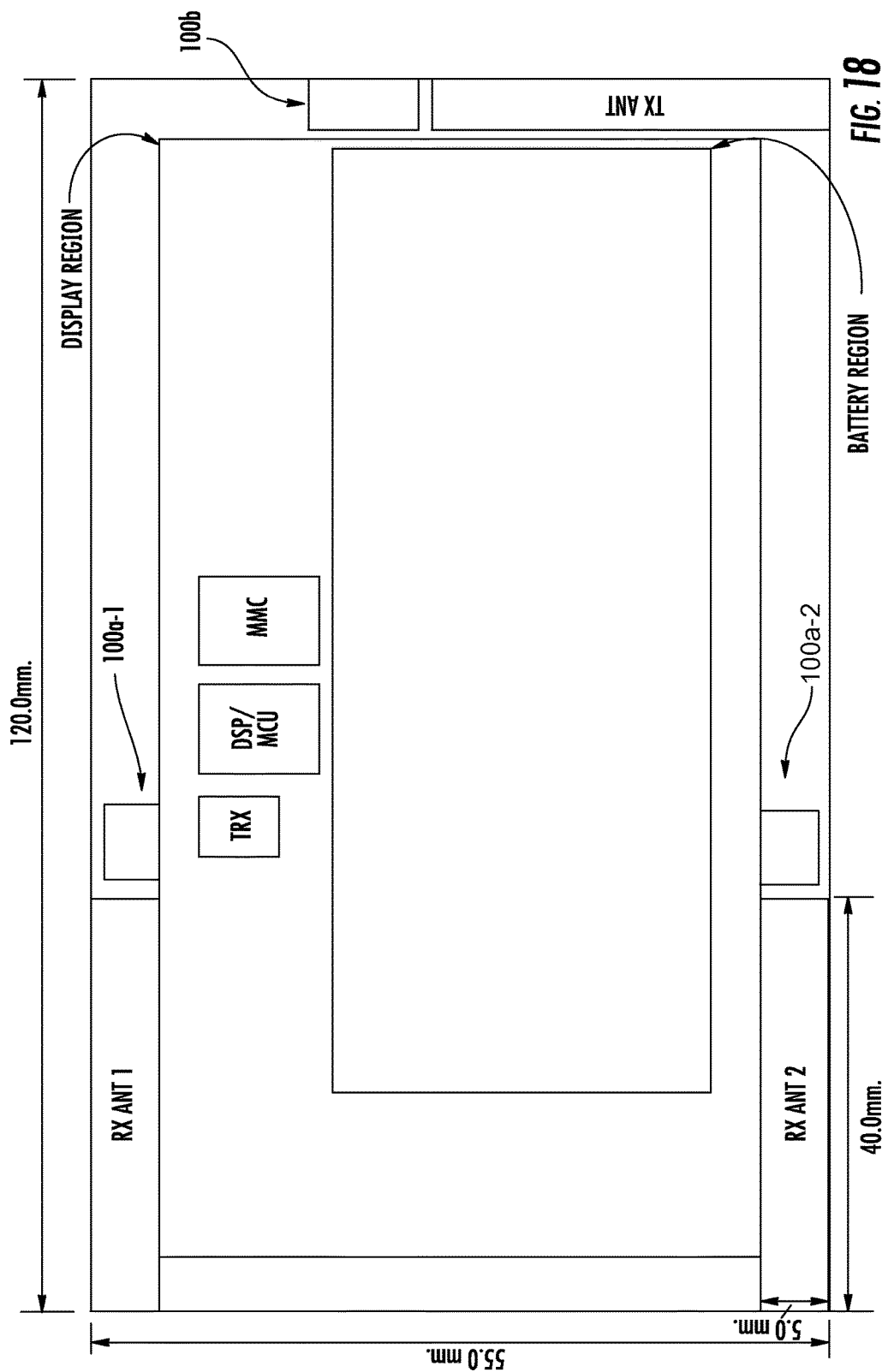
FIG. 18 is a smartphone floor plan according to an embodiment of the presently disclosed subject matter.

In this regard, in some embodiments, tunable filter 100 can be placed on a printed circuit board in a compartment of a phone having a compartment higher than 1 mm, which can allow tunable filter 100 to have a height of 1 mm or more. Alternatively or in addition, tunable filter 100 can be located on a PCB in a compartment of the phone not having vertical overlap with the region in which that the display is located. Furthermore, tunable filter 100 can be located on a PCB in a compartment of the phone not having vertical overlap with the region in which the battery is located. Some benefits of configuring a system to allow for such increased resonator size are shown in FIGS. 16 and 17, in which a comparison of inductor Q vs. inductor diameter (FIG. 16) and a resulting improvement of notch improvement vs. inductor diameter (FIG. 17) are shown using commercial inductors. An exemplary smartphone floor plan showing combined tunable filter/antenna modules, an RF transceiver TRX, a digital signal processor/micro controller unit DSP/MCU, and a multimedia controller MMC is illustrated in FIG. 18. In particular, in the embodiment shown in FIG. 18, a first receive tunable filter 100a-1, a second receive tunable filter 100a-2, and a transmit tunable filter 100b are arranged around the periphery of the system in locations where there is improved vertical clearance to allow for the use of larger resonators.

Figure 19:
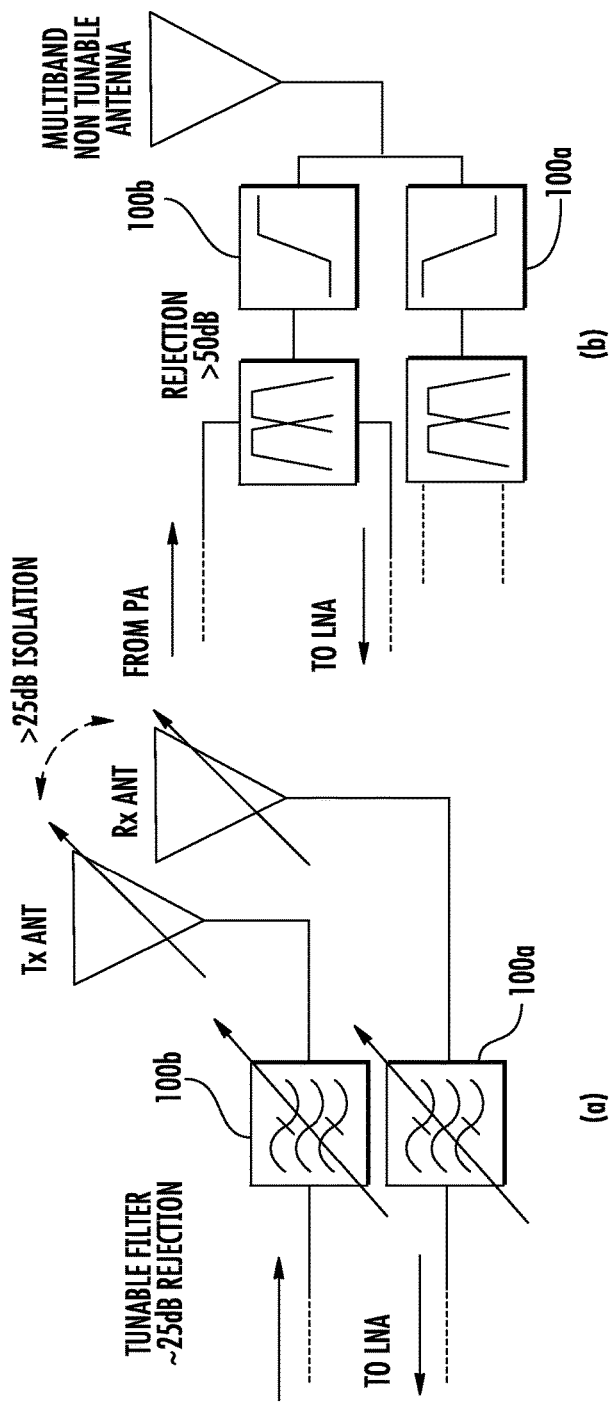
FIG. 19 illustrates schematic representations of antenna duplex systems incorporating tunable filters according to embodiments of the presently disclosed subject matter.

Regardless of the particular configuration, tunable filter 100 can be implemented in a wireless communication system, such as in a cellular communication system, to make a wireless frequency division duplex system that adapts filter responses to a selected radio communication requirement. As discussed above, conventional solutions require that the system switch between multiple filters (i.e., in a matched system e.g. 50 ohm) to allow for adjustments in the frequency ranges that are passed or blocked. In contrast, FIG. 19 illustrates two antenna duplex systems into which embodiments of tunable filter 100 can be implemented to serve multiple frequency bands without requiring multiple filters. In configuration (a), for example, a first tunable filter 100a and a second tunable filter 100b can be provided in communication with each of a reception antenna Rx ANT and a transmission antenna Tx ANT, respectively. Depending on the desired operating frequencies of both transmission and reception, the first and second tunable filters 100a and 100b can be tuned to provide minimum pass band attenuation and maximum stop band attenuation for the respective antennas. Alternatively, configuration (b) in FIG. 19 illustrates an embodiment in which a first tunable filter 100a and a second tunable filter 100b are implemented with a multiband antenna. Adjustments to the tuning state of first and second tunable filters 100a and 100b can again adjust the operating frequencies for both the reception and transmission, respectively, and they can further adapt their filter characteristics to both positive and negative receive-to-transmit duplex spacings. This configuration thus allows the resonators of first and second tunable filters 100a and 100b to be reused for both negative and positive duplex spacings. In this regard, first and second tunable filters 100a and 100b can be configured for tuning the signal path frequency response between one or more inputs and outputs.

In some embodiments, for example, the "sign" of the duplex spacing can be calculated (or looked up). In situations where duplex spacing is "negative" (e.g., bands 13, 14, 20, 24), the pass band of first tunable filter 100a can be set to be below the transmit band frequency. Otherwise, the pass band can be set to be above the transmit band frequency. In the transmit signal path, the reject band of second tunable filter 100b can be set to the receive band frequency (or as close to the reception band as the transmit band insertion loss allows). Again, if the duplex spacing is "negative," the pass band of second tunable filter 100b can be set to be above the receive band frequency. Otherwise, it can be set to be below the receive band frequency.

For finite Q components and particularly for LC circuits with minimized circuit complexity and insertion loss, the spacing between desired rejection and pass bands will be near enough to each other that the edges of the rejection and pass bands may be in the filter frequency response transition region between the reject notch and low insertion regions of the filter, In this case, a tradeoff in tuning setting can be made between the achieved rejection at the edge of the rejection band and the achieved insertion loss at the edge of the passband. It may be that he reject band of first tunable filter 100a can be set to the transmit band frequency, but if not, it can be set as close to the transmit band as the resulting reception band insertion loss specification allows.

Figure 20:
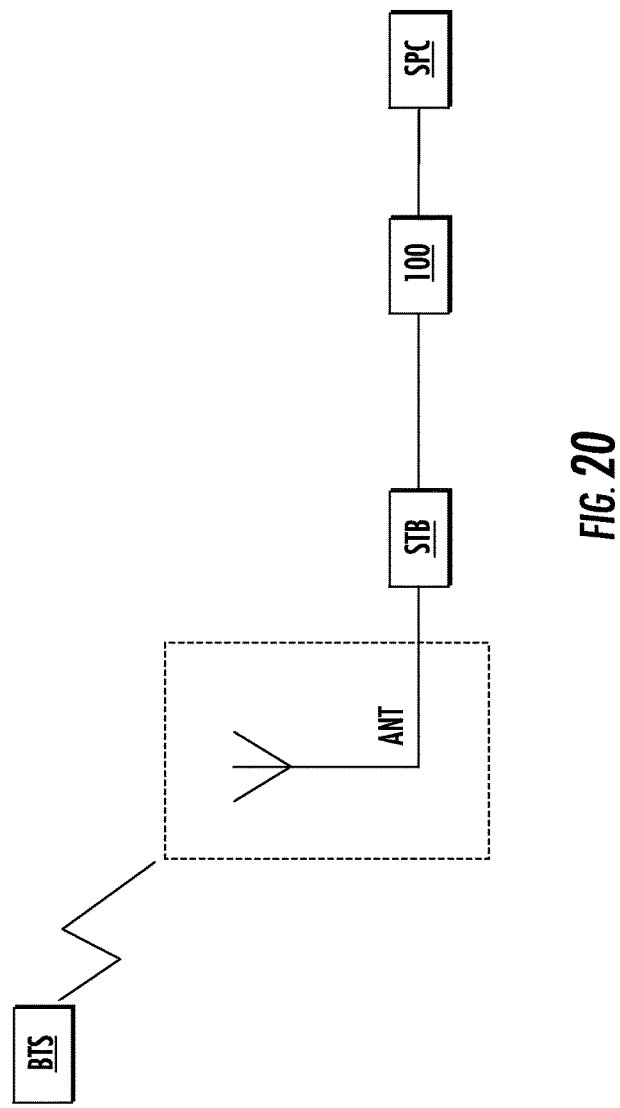
FIG. 20 illustrates a schematic representation of an antenna configuration incorporating a tunable filter according to an embodiment of the presently disclosed subject matter.
Figure 21:
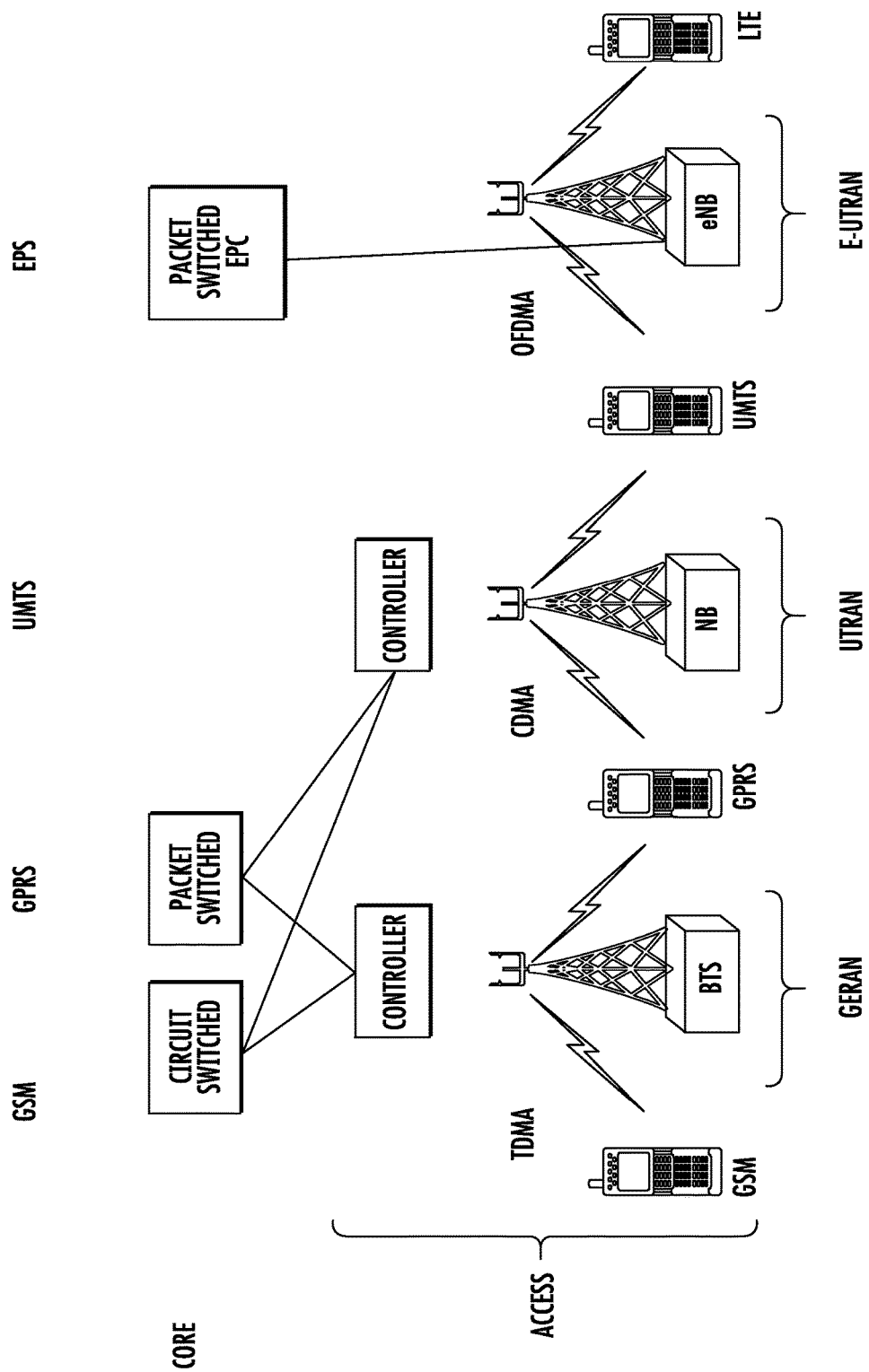
FIG. 21 illustrates a schematic representation of examples of various base stations and communication links for use with a tunable filter according to an embodiment of the presently disclosed subject matter.

In any configuration, rather than switching between multiple filters, tunable filter 100 can tune over a wide frequency range by changing the characteristics of the filter. Specifically, for example, tunable filter 100 can change reactive impedances within the filter circuit instead of switching at non-reactive impedances exterior to the filter circuit. For example, in a general configuration illustrated in FIG. 20, for example, an antenna ANT is connected to a signal transfer block STB, tunable filter 100, and a signal processing chain SPC and is configured for communicating with a remote wireless communication unit. For example, the remote wireless communication unit can be a base station (e.g., a cellular base station). For here we will use the terminology "base station" for any transponding unit using a fixed location antenna (i.e., a base) to serve one or more users or devices within an area. For instance, as shown in FIG. 20, the remote wireless communication unit can be a 3GPP base transceiver station BTS, although other units (e.g., NB and eNB) can be considered base stations according to this terminology. FIG.

21 illustrates examples of various base stations (e.g., BTS, NB, eNB) and communication links for 3GPP standards.

In this arrangement, antenna ANT provides electromagnetic coupling of a transmission or receive signal towards a remote wireless communication unit either through direct coupling (e.g., self-radiating antenna) or through coupling to another metallic surface (e.g., terminal ground chassis). In some configurations, antenna ANT can contain one or more signal path input/output and one or more connection points for load tuning. Furthermore, in some configurations, antenna ANT can itself contain a matching circuit that optionally can be tunable.

Signal transfer block STB provides signal connections between the antenna ANT and tunable filter 100. In this configuration, signal transfer block can include one or more of a fixed frequency filter (e.g., harmonic filter), an amplifier configured for amplifying levels between input and outputs, an electromagnetic coupling path (inductive or capacitive), a circuit for maximizing signal bandwidth, a conductive connection between inputs and outputs (e.g., short or transmission line type), or a combination thereof. Signal processing chain SPC is one or both of the input to the signal path to a unit that either further process the receive signal or the output to the signal path that process the transmission signal. In this regard, the unit that process the receive signal can include one or more of a low noise amplifier (LNA), a frequency selection down conversion mixer, a variable gain amplifier (VGA), a system of signal selection filtering, an ADC system and a digital processing system (e.g., DSP). The unit that process the transmission signal can include one or more of a digital processing system, an oscillator, a modulator, and one or more amplifier stages. In this arrangement, the system can be configured to communicate a modulated signal according to a wireless standard in accordance with a standardization body (e.g., 3GPP).

In some embodiments, for example, configurations for tunable filter 100 can selectively allow signals to be passed at either side of the reject band. In other words, tunable filter 100 can be tuned to have a reject band at either a transmit or receive frequency, and tunable filter 100 can be programmed to operate in either a first mode of operation in which the primary pass band at either the receive or transmit frequency is above the reject band frequency or a second mode of operation in which the primary pass band is below the receive or transmit frequency (i.e., reversible duplex order). Furthermore, in addition to being reversible with respect to the reject band, the pass band can be tunable to more than one frequency on one or more side of the reject band (i.e., tunable duplex spacing). Similarly, the reject band can likewise be tunable in frequency. In any configuration, as indicated above, the variation of the impedance required to change the impedance and/or frequency characteristics can be achieved by applying a pseudo static electric or magnetic field.

Figure 22:
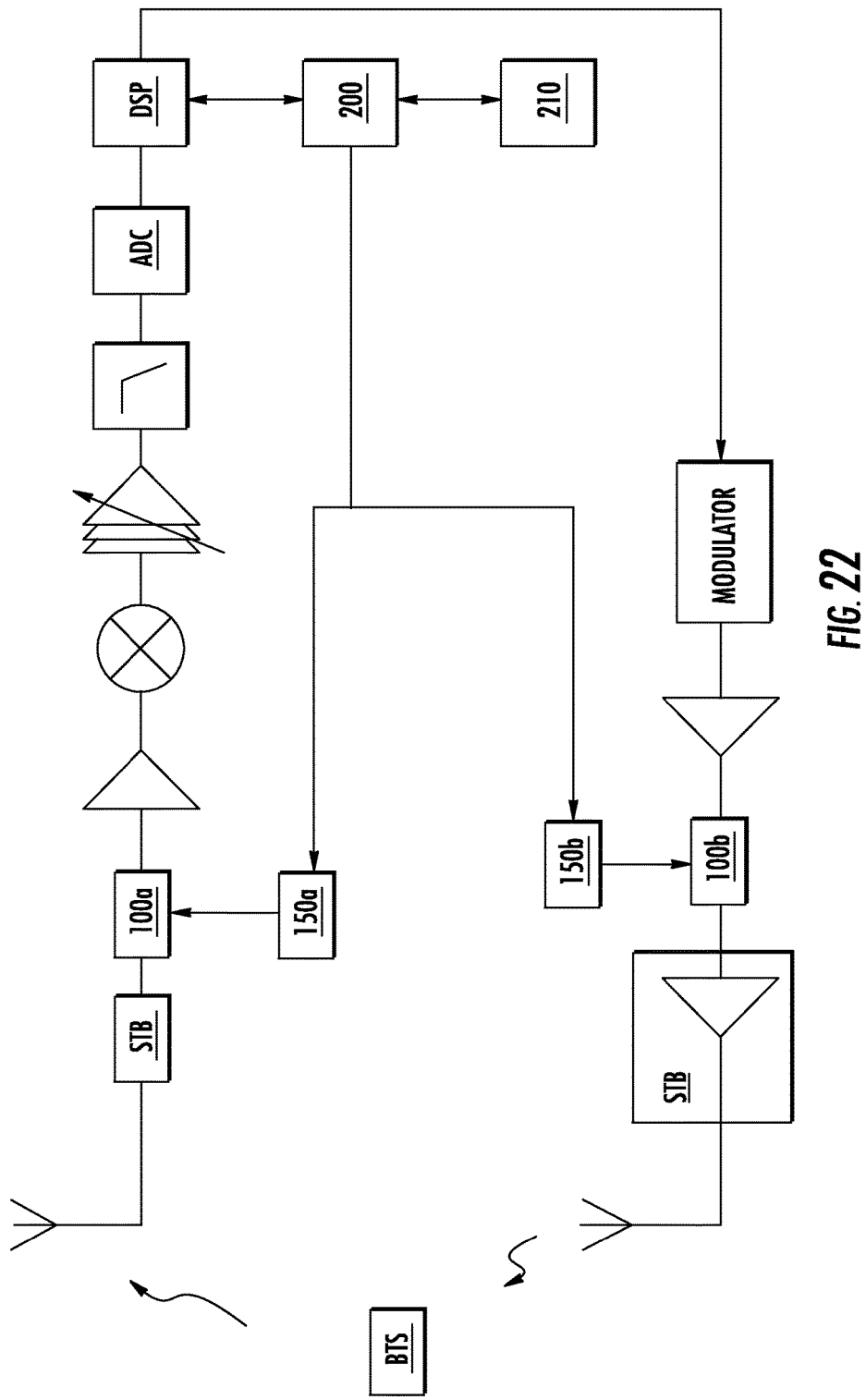
FIG. 22 illustrates a schematic representation of an antenna duplex system incorporating tunable filters according to an embodiment of the presently disclosed subject matter.

Using an exemplary configuration shown in FIG. 22, a wireless system can include first tunable filter 100a and a first controller 150a incorporated into a receive signal path, which can further include one or more of an LNA, a frequency selection quadrature down conversion mixer, a VGA, a system of signal selection filtering, an ADC system, and a digital processing system (e.g., DSP). In addition, first controller 150a can be connected in a signal link to an antenna, where the antenna receives signal from a base station and the output of first tunable filter 100a transfers the now filtered signal to a receive branch of the wireless device (e.g., LNA input). Likewise, a second tunable filter 100b and a second controller 150b can be incorporated into a transmit signal path. In addition, second tunable filter 100b can receive a signal from the transmit branch of a wireless device (e.g., from a power amplifier (PA) pre-driver), and by means of a signal transfer path (e.g., a PA) can transfer the transmit signal to the antenna element that further transfers the signal to a base station.

One or both of first tunable filter 100a and/or second tunable filter 100b can be configured to provide a tunable reject band and a tunable pass band relative to the respective reject band. In this regard, one or both of first controller and second controller 150a and 150b can comprise a digital control interface (e.g., a SPI, I2C or an RFFE interface), which can include a latch register and decoding and connection circuit capable of reading latch register information and apply this information to change the impedance of the variable elements in first tunable filter 100a or second tunable filter 100b, respectively. In some embodiments, one or both of first tunable filter 100a and/or second tunable filter 100b can respond (e.g., based on UE downlink protocol stack information) to commands giving by a wireless base station controller. In this way, the respective one of first tunable filter 100a or second tunable filter 100b can set up the frequency response according the band assigned for receive or transmit.

Alternatively, the respective one of first tunable filter 100a or second tunable filter 100b can set up the frequency response according to the physical frequency channel assigned for receive or transmit. In such a case, in situations where there is no downlink protocol link or broad cast information decoded (e.g., such that the circuit goes into a process of establishing a scan of power over frequency), first controller 150a and/or second controller 150b is configured to set up the frequency response of the respective one of first tunable filter 100a and/or second tunable filter 100b according to the channel, frequency, or frequency band being scanned for power (e.g. searching for high power broadcast channels). This information about channel or frequency can be taken either from the layered UE protocol stack (e.g., 3GPP channel numbers) or from somewhere in the processing chain that do translation of channel number to PLL setting. In this way, the respective one of first controller 150a or second controller 150b can set up the frequency response of the corresponding circuit or subcircuit according to the physical frequency channel assigned for receive or transmit, respectively.

Both of first controller and second controller 150a and 150b can receive control inputs from a master control unit 200 to control the communication protocols to and from the base station BTS. A multimedia controller or applications processor 210 can be provided in communication with master control unit 200 to control the user operating system (e.g., with a graphical interface), user applications, or the like. In some embodiments, the DSP, master control unit 200, and multimedia controller or applications processor 210 can have shared hardware and processor(s).

Regardless of the particular configurations of the connected equipment, tunable filter 100 can provide frequency-selective filtering response between its input and output terminals (e.g., first port P1 and second port P2 in the embodiments discussed above) according to the setting of a control unit provided in communication with tunable filter 100. Specifically, tunable filter 100 can be configured to provide tunable band reject characteristics and a programming mode allowing the primary reject frequency or frequencies to be moved (e.g., movable notch for suppressing duplex self-interferer). For example, tunable filter 100 can provide a tunable pass band characteristics and programming mode allowing the pass band frequency to be moved relative to the reject band frequency, and/or it can provide a tunable pass band characteristics allowing the primary pass band in one case to be above the primary reject band frequency and another mode allowing the primary pass band in this mode to be below the primary reject band frequency.

In this regard, a method for operating a tunable filter to support multiple frequency bands is provided. Referring to the system configuration shown in FIG. 22, for example, the method can be run by master control unit 200. The method can involve, while searching for signal power, looking up a scan frequency. The reject band of first tunable filter 100a can be tuned away from a PLL scan frequency, and first tunable filter 100a can further be programmed to align the pass band with the PLL scan frequency. A scan can be performed at the scan frequency, and a next scan frequency can be looked up. The pass- and reject-band settings can be reset again if the loss measured in first tunable filter 100a is too high at the scan frequency (or even as a default). Otherwise, the pass- and reject-band settings can be maintained for the next scan.

Once downlink BTS info is established the method can involve looking up the receive band frequency, tuning the reject band of first tunable filter 100a away from the receive band frequency (or alternatively to the transmit band frequency), and programming the pass band of first tunable filter 100a to align with the receive frequency.

If the system is being operated in a frequency-domain duplex mode, the method can involve receiving channel and band information from base station BTS. Master control unit 200 can calculate (or look up) the sign of the duplex spacing (i.e., positive or negative spacing) and set the rejection band of first tunable filter 100a to the transmit frequency (e.g., as close to the receive frequency as the insertion loss allows). If the duplex spacing is negative (e.g., operating in bands 13, 14, 20, 24), the pass band of first tunable filter 100a can be set to be below the transmit frequency. Otherwise, the pass band of first tunable filter 100a can be set to be above the transmit frequency. In either case, these filter settings can be sent to first controller 150a.

Similarly, the reject band of second tunable filter 100b can be set to the receive frequency (e.g., as close to the receive frequency as the insertion loss allows). If the duplex spacing is negative (e.g., operating in bands 13, 14, 20, 24), the pass band of second tunable filter 100b can be set to be above the receive frequency. Otherwise, the pass band of the second tunable filter 100b can be set to be below the receive frequency. In either case, these filter settings can be sent to second controller 150b.

The method described above is provided for a system in which both first tunable filter 100a (e.g., RX) and second tunable filter 100b (e.g., TX) are used. Other embodiments of a system incorporating one or more of tunable filter 100 in which only a receive signal filter or only a transmit signal filter implemented as those skilled in the art may recognize.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. An adaptive filter having an input node and an output node, the adaptive filter comprising:
a first resonator circuit connected between the input node and a signal node;
a second resonator circuit connected between the signal node and the output node; and
one or more impedance coupling elements connected between the signal node and a ground;
wherein the first resonator circuit and the second resonator circuit are selectively tunable to define a reject band configured to block signals having frequencies within a first signal band between the input node and the output node; and
wherein the one or more impedance coupling elements are selectively tunable to define a pass band configured to pass signals having frequencies within a second signal band between the input node and the output node, wherein the one or more impedance coupling elements are tunable both to a first mode at which a coupling impedance of the one or more impedance coupling elements is tuned such that the pass band has a minimum pass band insertion loss at frequencies that are less than frequencies within the reject band and to a second mode at which the coupling impedance of the one or more impedance coupling elements is tuned such that the pass band has a minimum pass band insertion loss at frequencies that are greater than frequencies within the reject band.

2. The tunable filter of claim 1, wherein the one or more impedance coupling elements comprise one or more capacitors.

3. The tunable filter of claim 2, wherein the one or more impedance coupling elements comprise one or more inductors connected in a series arrangement with the one or more capacitors.

4. The tunable filter of claim 2, wherein the one or more impedance coupling elements comprise one or more inductors connected in a parallel arrangement with the one or more capacitors.

5. The tunable filter of claim 1, wherein one or more of the first resonator circuit, the second resonator circuit, or the one or more impedance coupling element is electrically tunable.

6. The tunable filter of claim 5, wherein the one or more of the first resonator circuit, the second resonator circuit, or the one or more impedance coupling element comprises a variable or switchable capacitor.

7. The tunable filter of claim 6, wherein the variable or switchable capacitor comprises one or more of a ferroelectric, paraelectric, micro-electro-mechanical systems, or solid-state capacitor.

8. The tunable filter of claim 1, wherein one or both of the first resonator circuit or the second resonator circuit comprises an inductor and a capacitor.

9. The tunable filter of claim 8, wherein the inductor and the capacitor are connected in a parallel arrangement.

10. The tunable filter of claim 1, wherein one or more of conductor traces or inductors of the first resonator circuit and the second resonator circuit are arranged at an angle of between 45 degrees and 135 degrees.

11. The tunable filter of claim 1, wherein the first resonator circuit, the second resonator circuit, and the one or more impedance coupling element are configured such that loss in the pass band is less than 5 decibels and blocking isolation in the first resonator and the second resonator is greater than 15 decibels.

12. A method for adjusting a tunable filter, the method comprising:

connecting a first resonator between an input node and a signal node, wherein the first resonator is electrically tunable;

connecting a second resonator between the signal node and an output node, wherein the second resonator is electrically tunable;

connecting one or more coupling element between the signal node and a ground, wherein the one or more coupling element is electrically tunable;

selectively adjusting a tuning setting of one or more of the first resonator or the second resonator to define a reject band configured to block signals having frequencies within a first signal band between the input node and the output node; and selectively adjusting a tuning setting of the one or more coupling element to define a pass band configured to pass signals having frequencies within a second signal band between the input node and the output node;

wherein selective adjusting a tuning setting of the one or more coupling elements comprises selectively tuning the one or more coupling elements among a first mode at which a coupling impedance of the one or more coupling elements is tuned such that the pass band has a minimum pass band insertion loss at frequencies that are less than frequencies within the reject band and a second mode at which the coupling impedance of the one or more coupling elements is tuned such that the pass band has a minimum pass band insertion loss at frequencies that are greater than frequencies within the reject band.

13. The method of claim 12, wherein selectively adjusting a tuning setting of one or more of the first resonator or the second resonator to block signals within one or more frequency ranges comprises selectively adjusting a tuning setting of one or more of the first resonator or the second resonator to provide blocking isolation in the first resonator and the second resonator greater than 15 decibels.

14. The method of claim 12, wherein selectively adjusting a tuning setting of one or more of the first resonator or the second resonator comprises varying an electric field or current to the first resonator or the second resonator.

15. The method of claim 12, wherein selectively adjusting a tuning setting of the one or more coupling elements comprises selectively adjusting a tuning setting of the one or more coupling element to provide loss in the pass band is less than 5 decibels.

16. The method of claim 12, wherein selectively adjusting a tuning setting of the one or more coupling elements comprises selectively adjusting a tuning setting of the one or more coupling element to provide a simultaneous conjugate match to a first impedance at the first resonator and to a second impedance at the second resonator.

17. The method of claim 12, wherein selectively adjusting a tuning setting of one or more coupling element comprises varying an electric field or current to the one or more coupling element.

* * * * *